United States Patent
Kim et al.

(10) Patent No.: US 11,094,390 B2
(45) Date of Patent: Aug. 17, 2021

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Kyungryun Kim, Seoul (KR); Yoonna Oh, Seongnam-si (KR); Hohyun Shin, Hwaseong-si (KR); Jaeho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/795,730

(22) Filed: Feb. 20, 2020

(65) Prior Publication Data
US 2021/0012849 A1 Jan. 14, 2021

(30) Foreign Application Priority Data
Jul. 9, 2019 (KR) ........................ 10-2019-0082453

(51) Int. Cl.
| | |
|---|---|
| *G11C 29/18* | (2006.01) |
| *G11C 29/00* | (2006.01) |
| *G11C 29/42* | (2006.01) |
| *G11C 29/44* | (2006.01) |
| G11C 29/12 | (2006.01) |

(52) U.S. Cl.
CPC .............. *G11C 29/18* (2013.01); *G11C 29/42* (2013.01); *G11C 29/44* (2013.01); *G11C 29/76* (2013.01); *G11C 29/785* (2013.01); *G11C 29/787* (2013.01); *G11C 29/808* (2013.01); *G11C 2029/1202* (2013.01); *G11C 2029/1204* (2013.01); *G11C 2029/1802* (2013.01)

(58) Field of Classification Search
CPC .... G11C 29/808; G11C 29/785; G11C 29/787; G11C 29/18; G11C 29/42; G11C 29/44; G11C 29/76; G11C 2029/1202; G11C 2029/1204; G11C 2029/1802
USPC ............................................ 365/200, 189.09
See application file for complete search history.

(56) References Cited

U.S. PATENT DOCUMENTS

| | | | |
|---|---|---|---|
| 5,559,748 A | 9/1996 | Numata et al. | |
| 6,055,196 A | 4/2000 | Takai | |
| 6,067,260 A | 5/2000 | Ooishi et al. | |
| 6,233,181 B1 * | 5/2001 | Hidaka | G11C 29/808 365/200 |
| 6,469,949 B1 | 10/2002 | Hsu et al. | |

(Continued)

*Primary Examiner* — Son L Mai
(74) *Attorney, Agent, or Firm* — Muir Patent Law, PLLC

(57) ABSTRACT

A semiconductor memory device comprises a memory cell array including segments disposed at corresponding intersections of row and column blocks, each row block including dynamic memory cells coupled to word-lines and bit-lines, a row decoder that activates a first word-line of a first row block in response to a row address, determines whether the first row block is a master block based on a first fuse information and a second row block is mapped as a slave to the master block, activates a second word-line of the second row block, and outputs a row block information signal, and a column decoder accessing a portion of first memory cells coupled to the first word-line or a portion of second memory cells coupled to the second word-line based on a column address, the row block information signal and a second fuse information.

20 Claims, 20 Drawing Sheets

(56) References Cited

U.S. PATENT DOCUMENTS

| | | | |
|---|---|---|---|
| 6,697,979 B1 | 2/2004 | Vorbach et al. | |
| 7,131,039 B2 | 10/2006 | Howlett | |
| 7,196,951 B2 * | 3/2007 | Mori | G11C 29/808 |
| | | | 365/200 |
| 7,227,801 B2 * | 6/2007 | Kikutake | G11C 29/787 |
| | | | 365/225.7 |
| 7,916,558 B2 | 3/2011 | Do | |
| 8,964,494 B2 | 2/2015 | Lane et al. | |
| 10,706,953 B2 * | 7/2020 | Cho | G11C 29/846 |
| | | | 365/200 |
| 2019/0096508 A1 | 3/2019 | Kim et al. | |
| 2019/0304565 A1 | 10/2019 | Kim et al. | |

* cited by examiner

▨ : SELECTED SEGMENT
✕ : DEFECTIVE
| : REPLACE
— : REPAIR

SEMICONDUCTOR MEMORY DEVICES AND METHODS OF OPERATING SEMICONDUCTOR MEMORY DEVICES

CROSS-REFERENCE TO RELATED APPLICATIONS

This US application claims the benefit of priority under 35 USC § 119 to Korean Patent Application No. 10-2019-0082453, filed on Jul. 9, 2019, in the Korean Intellectual Property Office, the disclosure of which is incorporated by reference in its entirety herein.

BACKGROUND

The present disclosure relates to memories, and more particularly to semiconductor memory devices and methods of operating semiconductor memory devices.

Semiconductor chips are manufactured through semiconductor manufacturing processes, and then tested by a test equipment in a wafer, a die, or a package state. Defective semiconductor chips are selected through testing, and some defective cells of the defective chips are replaced with spare cells in a repair process to save the defective semiconductor chips. Currently, semiconductor chips such as dynamic random access memories (DRAMs) have been continued to be reduced in size through fine processes, and accordingly, the possibility of errors occurring during the manufacturing process has been increased. In addition, some errors (i.e., soft errors) may occur during chip operations and such soft errors may be detected and replaced by built-in self test (BIST) logic implemented in the semiconductor chips. Some fuses located in a row or column decoder of the semiconductor chips may be programmed using laser in the repair process or using electrical power in the BIST logic.

SUMMARY

Exemplary embodiments may provide a semiconductor memory device capable of increasing flexibility of column repair operation.

Exemplary embodiments may provide a method of operating a semiconductor memory device, capable of increasing flexibility of column repair operation.

According to an exemplary embodiment of the present invention, a semiconductor memory device comprises a memory cell array, a row decoder and a column decoder. The memory cell array includes a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines. The row decoder is configured to receive a row address, activate a first word-line of a first row block of the plurality of row blocks in response to the row address, wherein the first row block is identified with at least one block address bit of the row address, determine whether the first row block is a master block based on a first fuse information indicating that the first row block is the master block and a second row block of the plurality of row blocks is mapped as a slave to the master block, activate, in response to the determining of whether the first row block is the master block, a second word-line of the second row block of the plurality of row blocks, and output, in response to the activating of the second word-line, a row block information signal indicating that the second word-line is activated. The column decoder is configured to receive a column address, and access a portion of first memory cells coupled to the first word-line or a portion of second memory cells coupled to the second word-line of the second row block based on the column address, the row block information signal and a second fuse information indicating a first segment of the plurality of segments disposed at an intersection of the master block and a first column block associated with the column address.

According to an exemplary embodiment of the present invention, a semiconductor memory device includes a memory cell array, a row decoder, a column decoder and a peripheral circuit. The memory cell array includes a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines. The row decoder is configured to receive a row address, activate a first word-line of a first row block of the plurality of row blocks in response to the row address, wherein the first row block is identified with at least one block address bit of the row address, determine whether the first row block is a master block based on a first fuse information indicating that the first row block is the master block and a second row block of the plurality of row blocks is mapped as a slave to the master block, activate, in response to the determining of whether the first row block is the master block, a second word-line of the second row block of the plurality of row blocks, and output, in response to the activating of the second word-line, a row block information signal indicating that the second word-line is activated. The column decoder is configured to receive a column address, access a portion of first memory cells coupled to the first word-line or a portion of second memory cells coupled to the second word-line based on the column address, the row block information signal and a second fuse information indicating a first segment of the plurality of segments disposed at an intersection of the master block and a first column block, among the plurality of column blocks, associated with the column address. The peripheral circuit is configured to control the row decoder and the column decoder based on a command and an address received from an outside, the address including the row address and the column address.

According to an exemplary embodiment of the present invention, a method of operating a semiconductor memory device, wherein the semiconductor memory device includes a memory cell array including a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines, includes activating, by a row decoder, a first word-line of a first row block of the row blocks in response to a row address, wherein the first row block is identified with at least one block address bit of the row address, determining, by the row decoder, whether the first row block is a master block based on a first fuse information indicating that the first row block is the master block, activating, by the row decoder and in response to the determining of whether the first row block is the master blocks, a second word-line of a second row block of the row blocks, generating, in response to the activating of the second word-line, a row block information signal indicating that the second word-line is activated; and accessing, by a column decoder, a portion of first memory cells coupled to the first word-line or a portion of second memory cells coupled to the second word-line based on a column address, the row block information signal and a second fuse information, the second fuse information indicating that a first segment of the plurality of segments disposed at an intersection of the master block and a first column block associated with the column address.

BRIEF DESCRIPTION OF THE DRAWINGS

Exemplary embodiments will be described below in more detail with reference to the accompanying drawings.

DETAILED DESCRIPTION

Various exemplary embodiments will be described more fully hereinafter with reference to the accompanying drawings, in which exemplary embodiments are shown.

Figure 1:
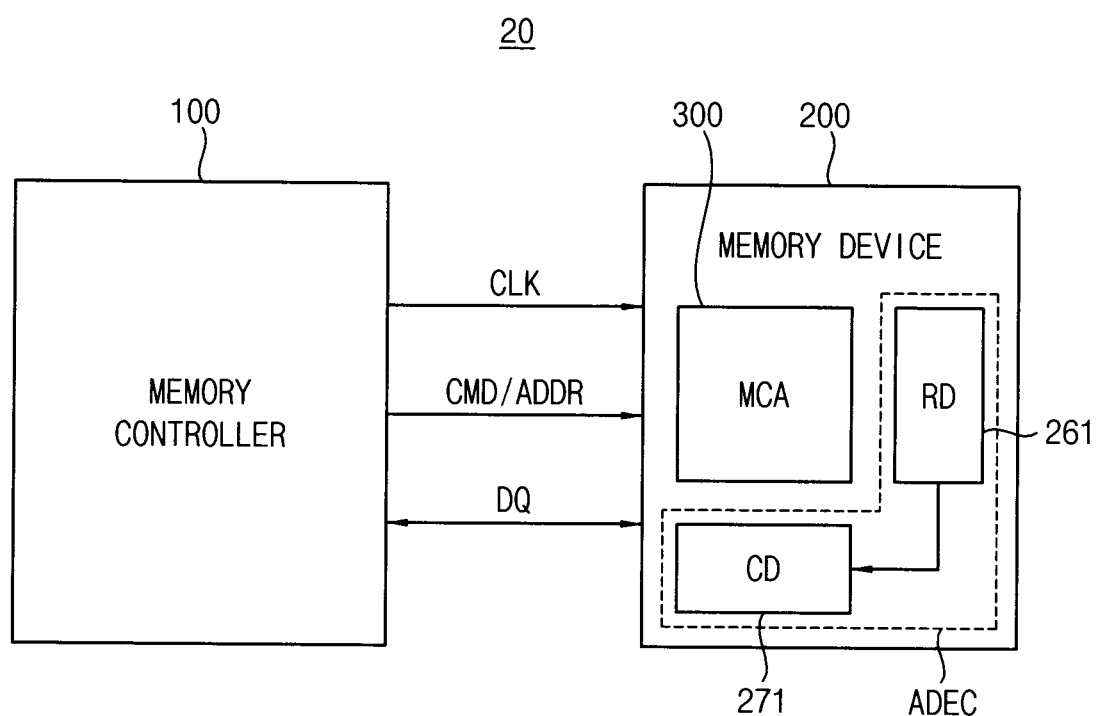
FIG. 1 is a block diagram illustrating a memory system according to exemplary embodiments.

FIG. 1 is a block diagram illustrating a memory system according to exemplary embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In some embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM or a LPDDR5 SDRAM.

The memory controller 100 transmits a clock signal CLK, a command CMD and an address (signal) ADDR to the semiconductor memory device 200 and exchanges data DQ with the semiconductor memory device 200.

The semiconductor memory device 200 includes a memory cell array 300 that stores the data DQ, and an address decoder ADEC. The address decoder ADEC may include a row decoder 261 and a column decoder 271.

The memory cell array 300 may include a plurality of row blocks arranged in a first direction, each of the plurality of row blocks includes a plurality of dynamic memory cells coupled to word-lines and bit-lines, each of the plurality of the row blocks is identified by a row block identity bit (i.e., at least one block address bit) corresponding to a portion of bits of a row address, and each of the of row blocks includes a plurality of segments arranged in a second direction crossing the first direction.

The row decoder 261 may activate a first word-line in a first row block in response to the row address, may activate a second word-line in a second row block which is different from the first row block and is mapped as a slave to the first row block in response to first fuse information indicating that the first row block is a master and may provide the column decoder 271 with a row block information signal indicating that the second word-line is activated. The column decoder 271 may access a portion of first memory cells coupled to the first word-line and a portion of second memory cells coupled to the second word-line based on a column address, the row block information signal and a second fuse information. Therefore, the semiconductor memory device 200 may increase flexibility of a column repair operation.

Figure 2A:
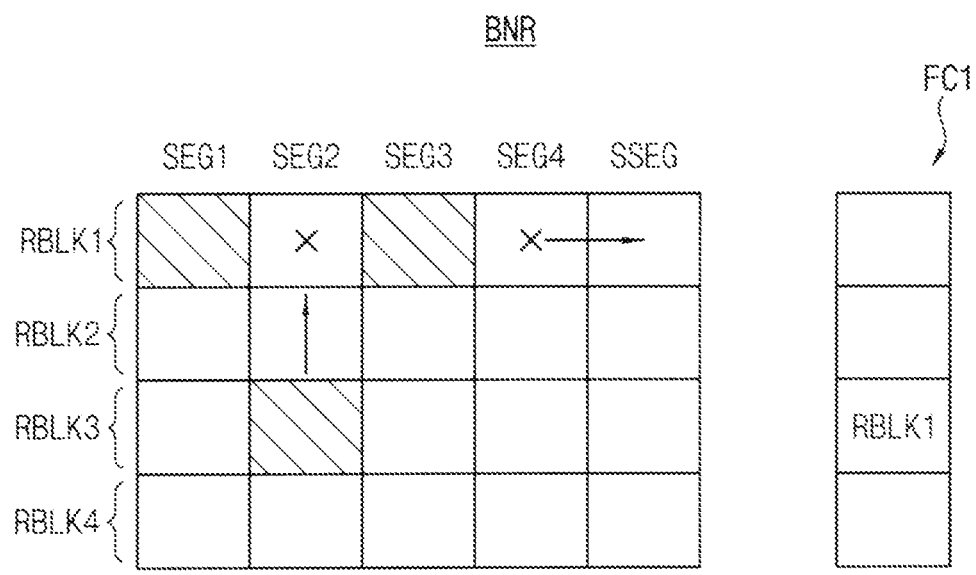
FIGS. 2A and 2B illustrate that the semiconductor memory device performs a column repair operation, respectively, according to exemplary embodiments.
Figure 2A:
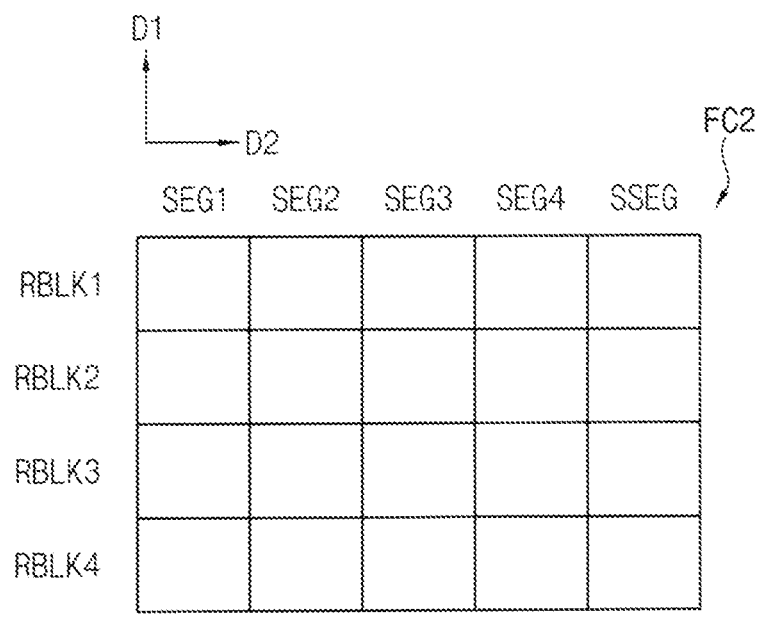
Figure 2B:
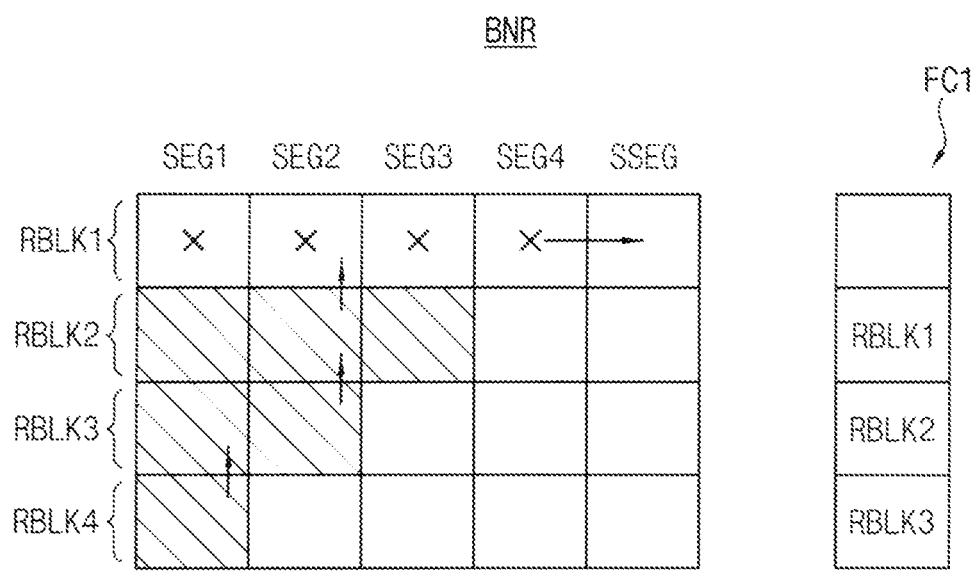
Figure 2B:
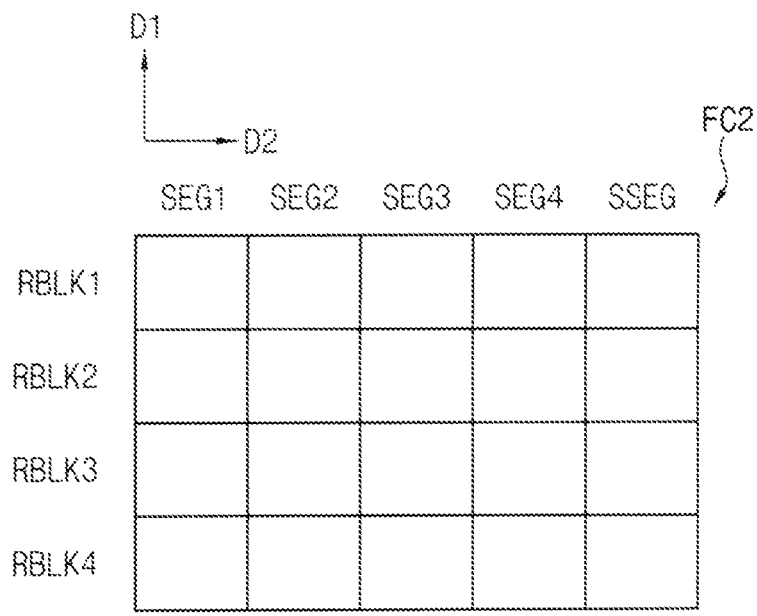

FIGS. 2A and 2B illustrate that the semiconductor memory device performs a column repair operation, respectively, according to exemplary embodiments.

FIGS. 2A and 2B illustrates that the address decoder ADEC performs a column repair operation on a bank array BNR included in the memory cell array 300 in FIG. 1, respectively.

Referring to FIG. 2A, the bank array BNR includes a plurality of row blocks RBLK1~RBLK4 arranged in a first direction D1 which are identified by a row block identity bit corresponding to a portion of bits of a row address. Each of the row blocks RBLK1~RBLK4 may include a plurality of normal segments SEG1~SEG4 and a least one spare segment SSEG which are arranged in a second direction D2 crossing the first direction D1.

A first fuse circuit FC1 may be included in the row decoder 261 in FIG. 1, for example. The first fuse circuit FC1 may store information associated with a first row block and a second row block as first fuse information. The first row block may be designated as a master and the second row block may be mapped as a slave to the first row block. In FIG. 2A, the row block RBLK1 is a master (i.e., a master block) and the row block RBLK3 is a slave (i.e., a slave block) to the row block RBLK1.

A second fuse circuit FC2 may be included in the column decoder 271 in FIG. 1, for example. The second fuse circuit FC2 may store segment information as second fuse information. The segment information of the second fuse circuit FC2 may indicate a segment of the segments in the first row block, which is a master, to be replaced with at least one of segments in the second row block which is a slave.

Referring to FIG. 2A, the segment SEG2 of the row block RBLK1, which includes a defective cell is replaced/repaired with the segment SEG2 of the row block RBLK3. In addition, the segment SEG4 of the row block RBLK1, which includes a defective cell, may be repaired with the spare segment SSEG.

Referring to FIG. 2B, the segments SEG1, SEG2 and SEG3 of the row block RBLK1, each of which includes a defective cell, are replaced with the segments SEG1, SEG2 and SEG3 of the row block RBLK2 respectively, the segments SEG1 and SEG2 of the row block RBLK2 are replaced with the segments SEG1 and SEG2 of the row block RBLK3 respectively and the segment SEG1 of the row block RBLK3 is replaced with the segment SEG4 of the row block RBLK4. In addition, the segment SEG4 of the row block RBLK1, which includes a defective cell may be repaired with the spare segment SSEG.

In FIG. 2B, the row block RBLK2 is mapped as a slave to the row block RBLK1, the row block RBLK3 is mapped as a slave to the row block RBLK2, and the row block RBLK4 is mapped as a slave to the row block RBLK3.

The first fuse information and the second fuse information may be stored in the first fuse circuit FC1 and the second fuse circuit FC2 in advance through testing the memory cell array 300 or the bank arrays BNR.

The column decoder 271 may repair each of the defective cells of the segment SEG2 in the row block RBLK1 with normal memory cells of the segment SEG2 in the row block RBLK2 and may replace the segment SEG2 in the row block RBLK2 with the segment SEG2 in the row block RBLK3.

Figure 3:
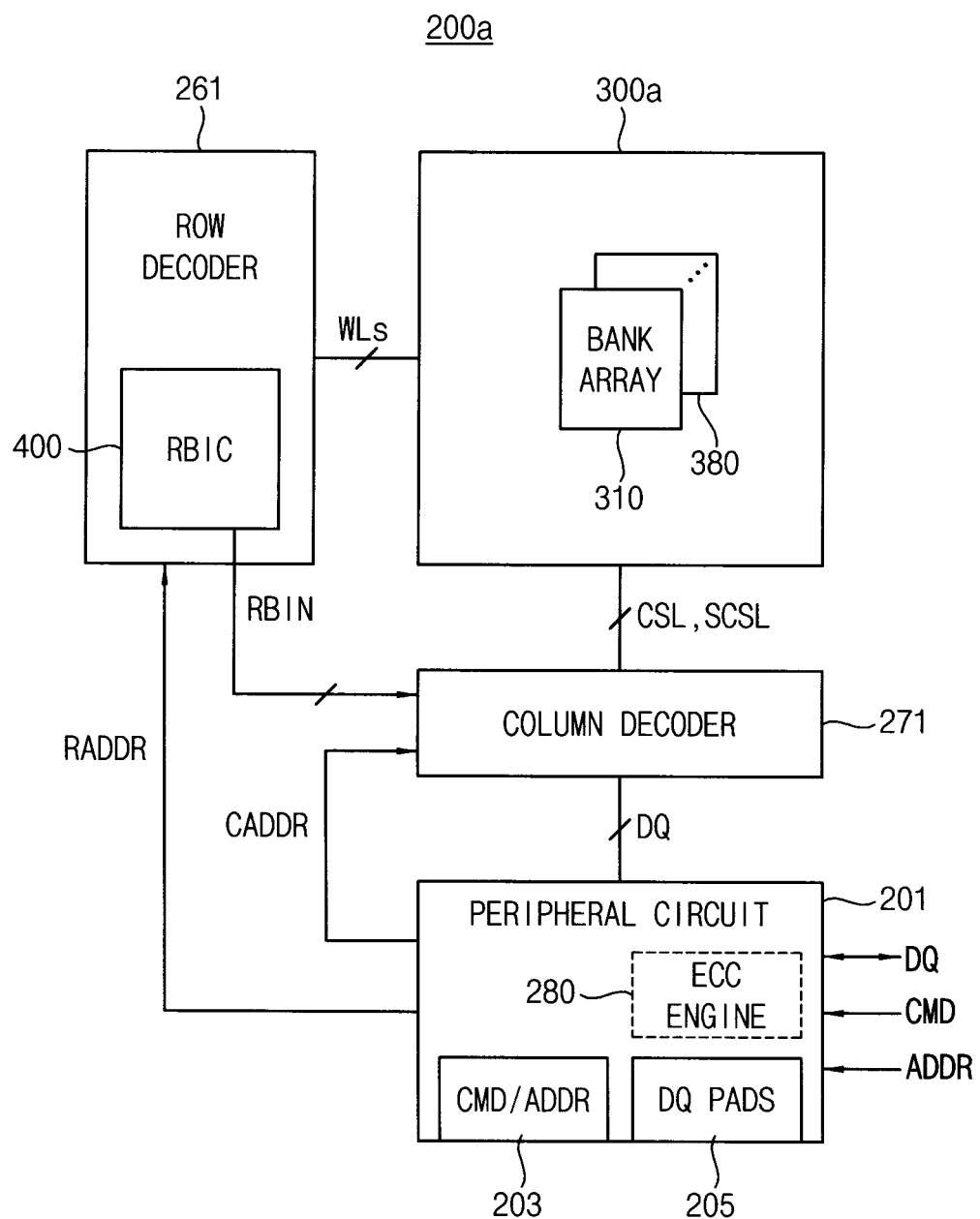
FIG. 3 is a block diagram illustrating an example of the semiconductor memory device in FIG. 1 according to exemplary embodiments.

FIG. 3 is a block diagram illustrating an example of the semiconductor memory device in FIG. 1 according to exemplary embodiments.

Referring to FIG. 3, a semiconductor memory device 200a includes a memory cell array 300a, a row decoder 261, a column decoder 271 and a peripheral circuit 201.

The memory cell array 300a may include a plurality of bank arrays 310~380, and each of the bank arrays 310~380 may include a plurality of row blocks as described with reference to FIGS. 2A and 2B.

The semiconductor memory device 200a may receive an active command before receiving a write command or a read command from the outside (e.g., a memory controller or test equipment).

All memory cells connected to the word-line of the semiconductor memory device 200a may be selected based on the active command. Afterwards, if the semiconductor memory device 200a receives the write command or the read command, a plurality of bit-lines may be selected. In an embodiment, the bit-lines may be selected by the write command or the read command. The data input/output may be performed on memory cells coupled to the selected bit-lines.

Parity data for correction errors of data stored in at least one of the bank arrays 310~380 may be stored in some of the bank arrays 310~380.

The column decoder 271 may be connected to the memory cell array 300a through column selection lines CSL and spare column selection lines SCSL. The column decoder 271 may select the column selection lines CSL or the spare column selection lines SCSL based on a write command or a read command. If the column decoder 271 selects the column selection lines CSL, the normal segments are selected. When the column decoder 271 selects the spare column selection lines SCSL, a spare segment is selected. Each of the normal segments includes normal memory cells coupled to a word-line and bit-lines and the spare segment includes spare memory cells coupled to the word-line and spare bit-lines.

The peripheral circuit 201 may include a command/address pads (CMD/ADD) 203, input/output pads 205, and an error correction code (ECC) engine 280. In an embodiment, the ECC engine 280 may not be included in the peripheral circuit 201. The peripheral circuit 201 may receive the command CMD and the address ADDR from outside and may exchange data DQ with the outside.

The peripheral circuit 201 may provide a column address CADDR to the column decoder 271 and may provide a row address RADDR to the row decoder 261 according to the command CMD received from the outside. The peripheral circuit 201 may provide input data DQ to the column decoder 271 in response to the write command or may receive output data DQ from the column decoder 271 in response to the read command. The input data may be input to the peripheral circuit 201 through the input/output pads 205. The output data may be output to the memory controller 100 through the input/output pads 205.

The ECC engine 280 may perform an ECC encoding on the input data to generate parity data. The ECC engine 280 may store the input data and the parity data in the bank arrays 310~380. The ECC engine 280 may perform an ECC decoding on the data read from the bank arrays 310~380 to correct at least one error in the read data. The ECC engine 280 may transmit the corrected data to the memory controller 100 through the input/output pads 205.

The row decoder 261 may activate a first word-line in a first row block designated by the row address RADDR, in response to the row address RADDR, may activate a second word-line in a second row block different from the first row block when the first row block is a master and may output a row block information signal RBIN indicating that the second word-line is activated. The row decoder 261 may include a row block information circuit 400 that may store row block information of each of row blocks and may output the row block information signal RBIN.

Figure 4:
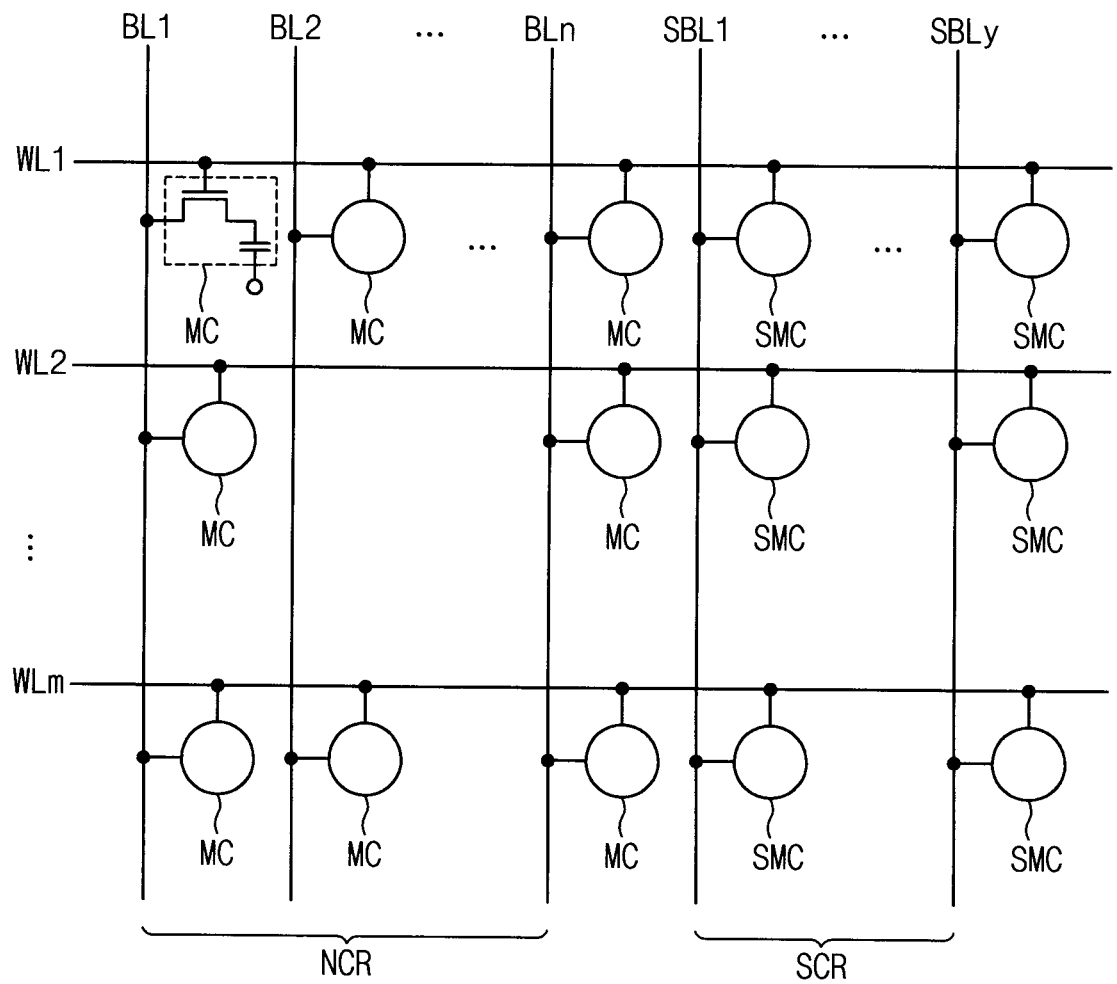
FIG. 4 illustrates an example of a first bank array in the semiconductor memory device of FIG. 3.

FIG. 4 illustrates an example of a first bank array in the semiconductor memory device of FIG. 3.

Referring to FIG. 4, a first bank array 310 includes a normal cell region NCR and a spare cell region SCR. The normal cell region NCR includes a plurality of word-lines WL1~WLm (m is a natural number greater than two), a plurality of bit-lines BL1~BLn (n is a natural number greater than two), and a plurality of memory cells MCs disposed at intersections between the word-lines WL1~WLm and the bit-lines BL1~BLn. The spare cell region SCR includes a plurality of spare bit-lines SBL1~SBLy (y is a natural number greater than two), the word-lines WL1~WLm, and a plurality of spare cells SMCs disposed at intersections between the word-lines WL1~WLm and the spare bit-lines SBL1~SBLy.

The word-lines WL1~WLm extend in a second direction D2 and the bit-lines BL1~BLn and the spare bit-lines SBL1~SBLy extend in a first direction D1 crossing the second direction D2. The first bank array 310 may be divided into a plurality of row blocks by at least one row block identity bit of the row address RADDR and each of the row blocks may be divided into at least two segments in the second direction D2 by at least one segment identity bit of the column address CADDR. With at least one segment identity bit of the column address CADDR, the first bank array 310 may be divided into a plurality of column blocks. The first bank array 310 may include a plurality of segments arranged in the first and second directions D1 and D2. Each of the plurality of segments may be positioned at a corresponding intersection of the plurality of row blocks and the plurality of column blocks.

In exemplary embodiments, the first bank array may be a representative bank array of the plurality of bank arrays 310~380. The present invention is not limited thereto. In an example embodiment, other bank arrays 320~380 may not include the spare cell array SCA.

Figure 5:
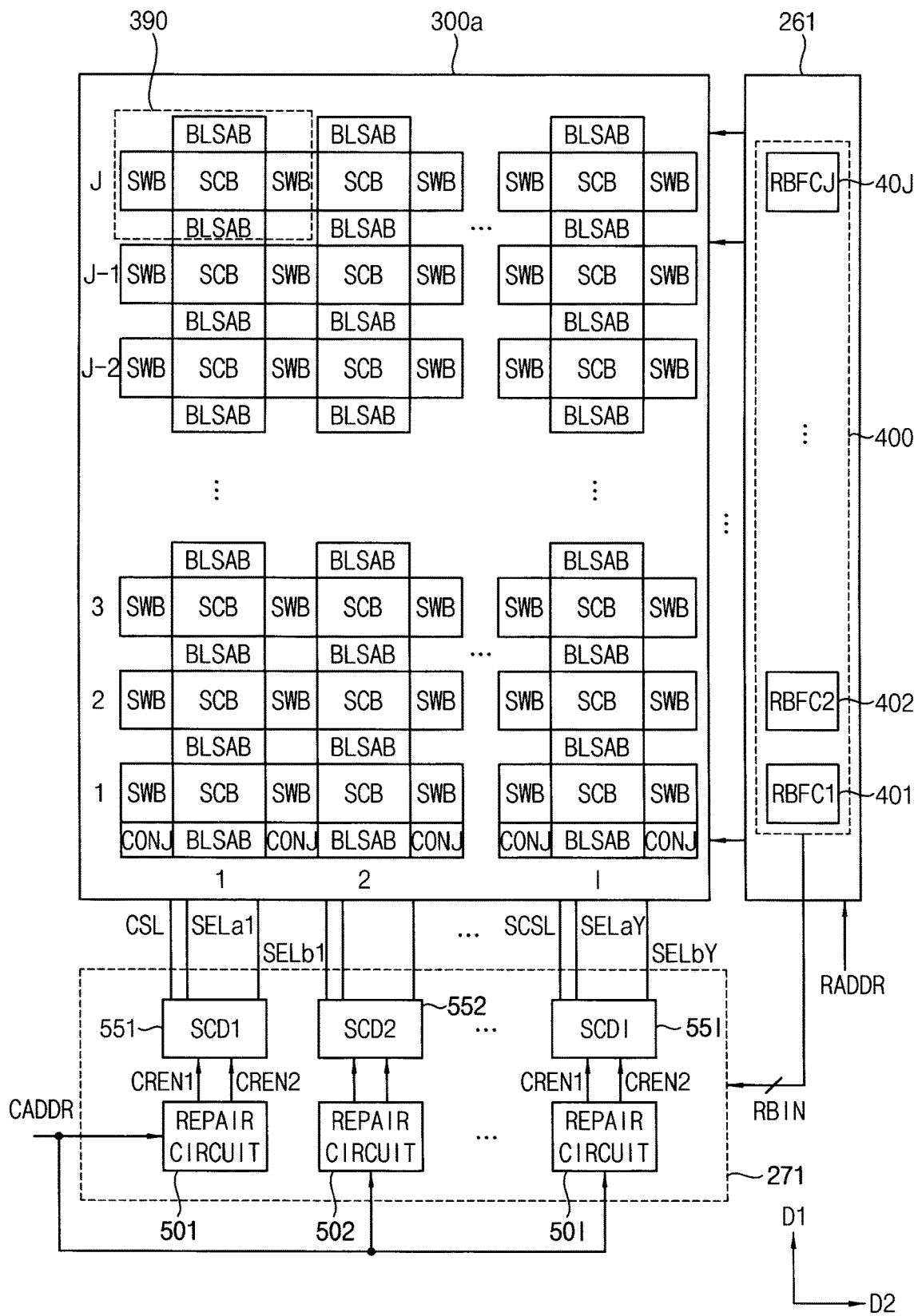
FIG. 5 illustrates the memory cell array, the row decoder and the column decoder in the semiconductor memory device of FIG. 3.

FIG. 5 illustrates the memory cell array, the row decoder and the column decoder in the semiconductor memory device of FIG. 3.

Referring to FIG. 5, in the memory cell array 300a, I sub-array blocks SCB may be disposed in the second direction D2, and J sub-array blocks SCB may be disposed in the first direction D1 substantially perpendicular to the second direction D2. I and J represent a number of the sub-array blocks SCB in the second direction and the first direction, respectively, and are natural numbers greater than two. The sub-array block SCB may correspond to the segment SEG in FIG. A. I sub-array blocks SCB may be disposed in the second direction D2 in one row and may be referred to as a row block. J sub-array blocks SCB may be disposed in the first direction D1 in one column and may be referred to as a column block. A plurality of bit-lines, a plurality of word-lines, and a plurality of memory cells may be disposed in each of the sub-array blocks SCB.

I+1 sub word-line driver regions SWB may be disposed between the sub-array blocks SCB in the second direction D2. Sub word-line drivers may be disposed in the sub word-line driver regions SWB. J+1 bit-line sense amplifier regions BLSAB may be disposed, for example between the sub-array blocks SCB in the first direction D1. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. A voltage generator is disposed in each of the conjunction regions CONJ.

The row decoder 261 includes the row block information circuit 400 and the row block information circuit 400 may include a plurality of row block fuse circuits RBFC1~RBFCJ 401~40J corresponding to the row blocks in the first direction D1. The row block fuse circuits 401~40J may output the row block information signal RBIN to the column decoder 271 in response to the row block identity bits of the row address RADDR.

The column decoder 271 may include a plurality of sub column decoders 551~55I and a plurality of repair circuits 501~50I. Each of the sub column decoders 551~55I may be connected to a corresponding one of a plurality of column blocks each of which including J sub-array blocks SCB in one column. Each of the plurality of repair circuits 501~50I may be connected to a corresponding one of the plurality of sub column decoders 551~55I.

Each of the repair circuits 501~50I may selectively activate a first repair signal CREN1 and a second repair signal CREN2 in response to the column address CADDR and the row block information signal RBIN to provide the first repair signal CREN1 and the second repair signal CREN2 to corresponding one of the sub column decoders 551~55I. Each of the sub column decoders 551~55(I-1) may select the column selection lines CSL and the sub column decoder 55I may select the spare column selection line SCSL in response to the first repair signal CREN1 and the second repair signal CREN2. In addition, each of the sub column decoders 551~55I may output each of first selection signals SELa1~SELaY and each of the second selection signals SELb1~SELbY which are associated with selecting corresponding segments.

A portion 390 of the memory cell array 300a will be described in FIG. 12.

Figure 6:
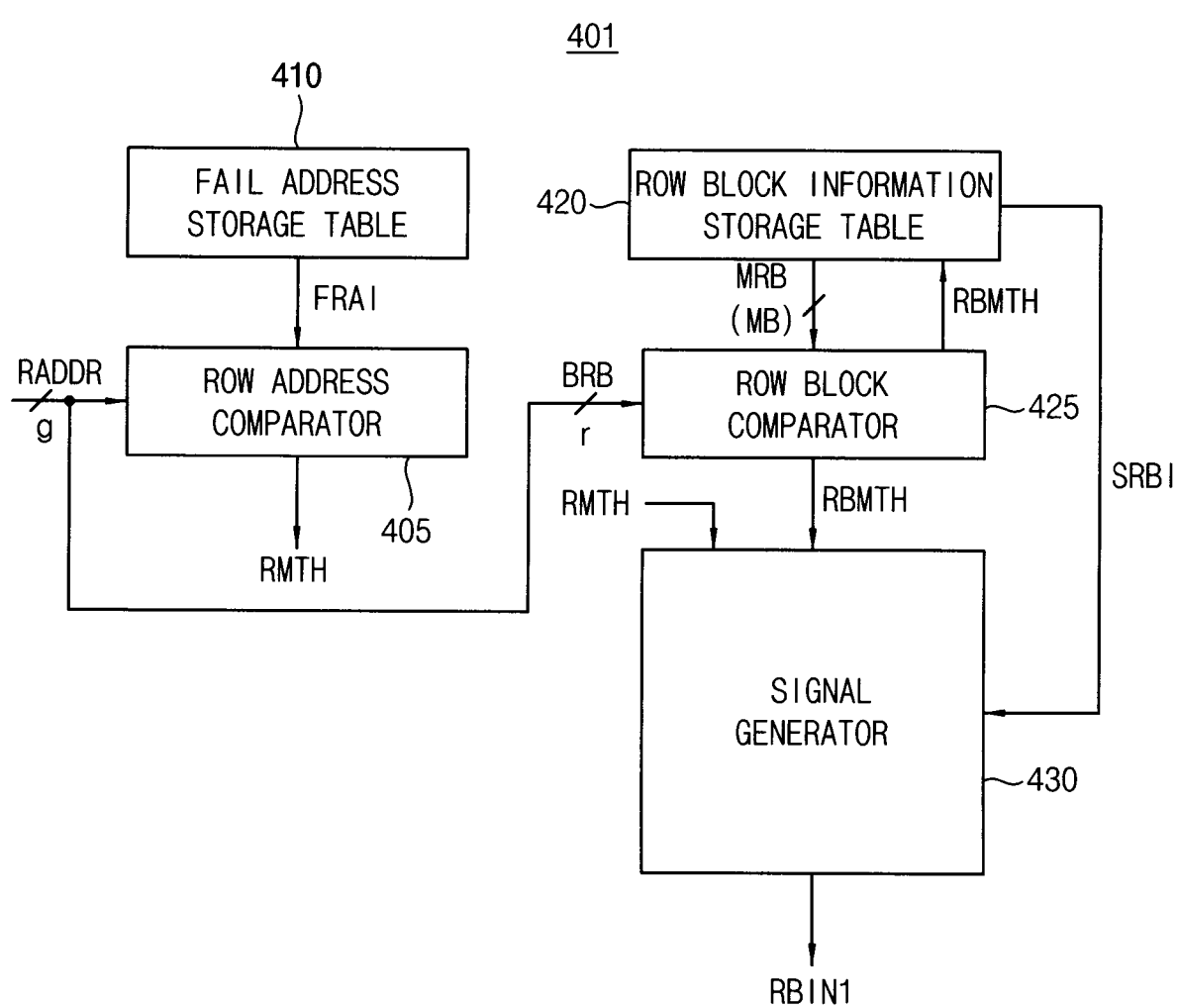
FIG. 6 is a block diagram illustrating one of the row block fuse circuits in FIG. 5 according to exemplary embodiments.

FIG. 6 is a block diagram illustrating one of the row block fuse circuits in FIG. 5 according to exemplary embodiments.

Each configuration of the row block fuse circuits 402~40J may be substantially the same as a configuration of the row block fuse circuit 401.

Referring to FIG. 6, the row block fuse circuit 401 may include a defective (fail) address storage table 410 (i.e., a defective address table storage), a row address comparator 405, a row block information storage table 420 (i.e., a row block information table storage), a row block address comparator 425 and a signal generator 430.

The defective address storage table 410 stores a defective row block address information FRAI associated with address information of defective cells of segments included in the corresponding row block. The row address comparator 405 compares the row address RADDR with the defective row block address information FRAI to output a row match signal RMTH indicating whether row address RADDR matches the defective row block address information FRAI.

The row block information storage table 420 may store a master bit MB indicating whether the corresponding row block is a master, (master) row block information MRB associated with address information of the corresponding row block and a slave row block information SRBI associated with address information of a slave row block including a second word-line. The row block information storage table 420 may correspond to the first fuse circuit FC1 of FIGS. 2A and 2B. The master row block information MRB and the slave row block information SRBI may correspond to the first fuse information.

The row block information storage table 420 may provide the master row block information MRB to the row block address comparator 425. The row block address comparator 425 may compare row block identity bits BRB with the master row block information MRB to provide the row block information storage table 420 and the signal generator 430 with a row block match signal RBMTH indicating whether the row block identity bits BRB match the master row block information MRB.

The row block identity bits BRB may include some upper bits of the row address RADDR. When the row address RADDR includes g-bit, upper r-bit of the row address RADDR may correspond to the row block identity bits BRB. The row block information storage table 420 may provide the signal generator 430 with slave row block information SRBI associated with a row block including the second word-line, in response to the row block match signal RBMTH.

The signal generator 430 may output the row block information signal RBIN1 to the column decoder 271 in response to the row match signal RMTH, the row block match signal RBMTH and the slave row block information SRBI.

Figure 7:
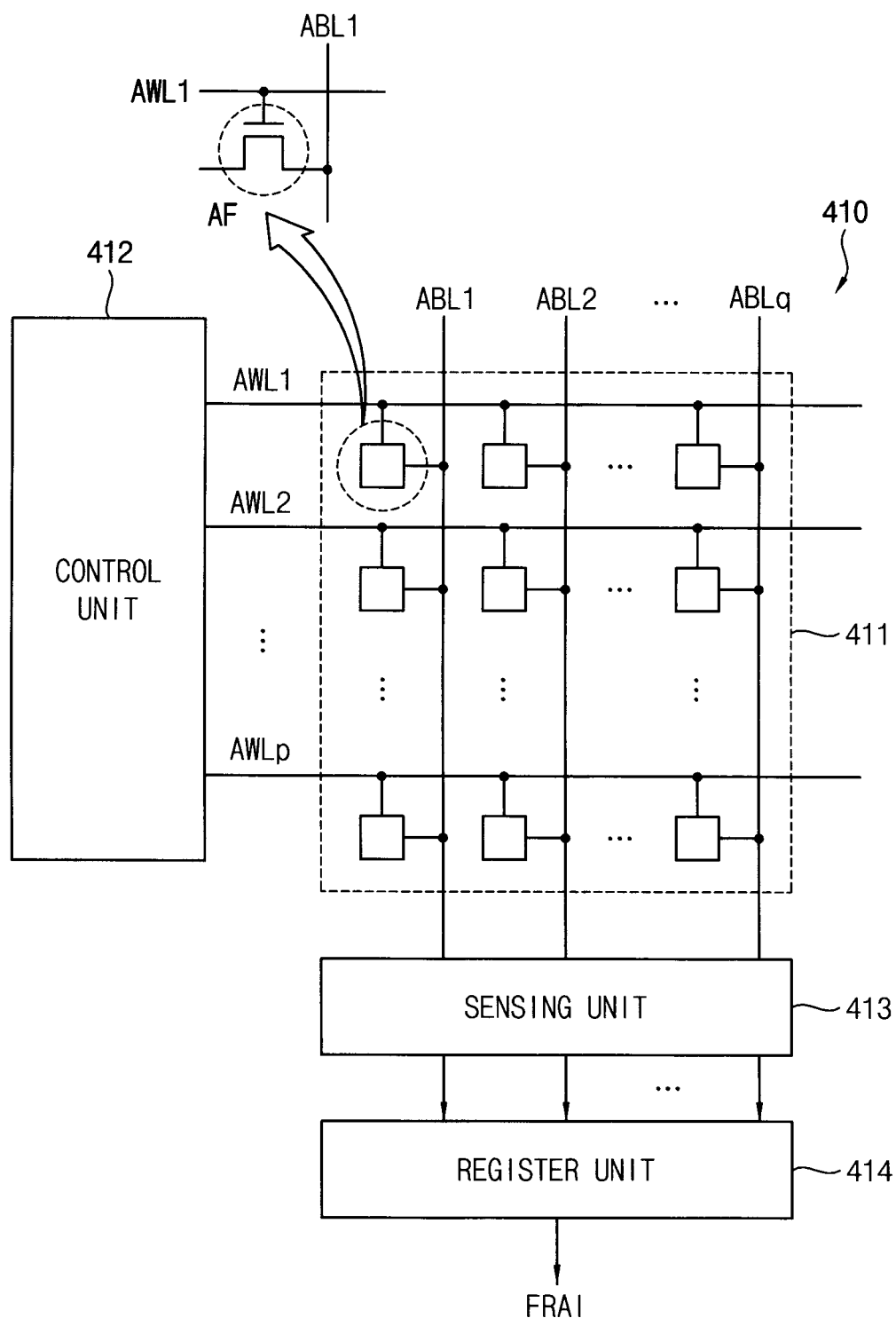
FIG. 7 illustrates an example of the row block information storage table in the row block fuse circuit of FIG. 6.

FIG. 7 illustrates an example of the row block information storage table in the row block fuse circuit of FIG. 6.

Referring to FIG. 7, the defective address storage table 410 includes anti-fuse array 411, a control unit 412, a sensing unit 413 and a register unit 414.

The anti-fuse array 411 includes p*q anti-fuses (AFs) which are respectively connected to intersections of p rows and q columns. The anti-fuse array 411 includes p word-lines AWL1 to AWLp for accessing anti-fuses (AFs) disposed at the p rows, and q bit-lines ABL1 to ABLq disposed to correspond to q columns so as to deliver information read from the anti-fuses (AFs).

The control unit 412 programs a defective row address information FBRI in the anti-fuse array 412, or reads the defective row address information FBRI from the anti-fuse array 412. The sensing unit 413 may sense and amplify the defective row address information FBRI received from the anti-fuse array 411 and output a result of the amplifying. The register unit 414 may temporarily store the defective row address information FBRI received from the sensing unit 413. The register unit 414 outputs the defective row address information FBRI to row address comparator 405.

Figure 8:
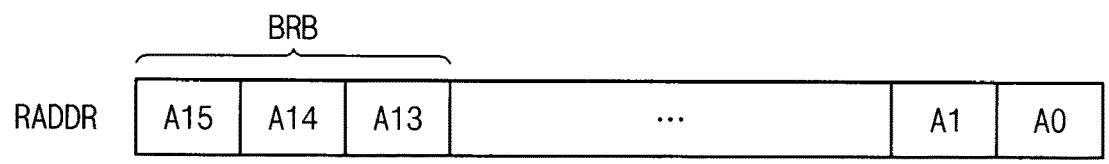
FIG. 8 illustrates an example of the row address in FIG. 6.

FIG. 8 illustrates an example of the row address in FIG. 6.

In FIG. 8, it is assumed that the row address RADDR includes 16-bit A0~A15.

Referring to FIG. 8, upper 3-bit A15~A13 of the row address RADDR may be designated as the row block identity bits BRB. In this case, each of the bank arrays 310~380 may be divided into eight row blocks disposed in the first direction D1.

Figure 9:
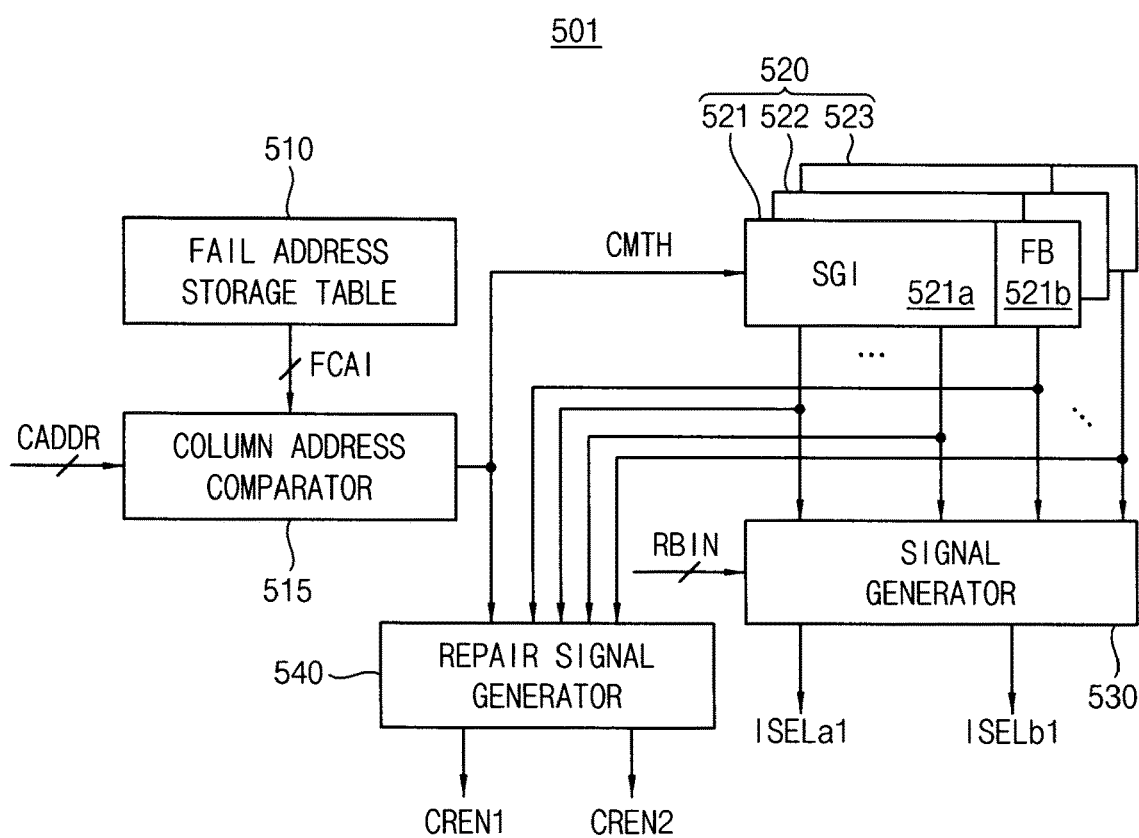
FIG. 9 is a block diagram illustrating one of the repair circuits in FIG. 5 according to exemplary embodiments.

FIG. 9 is a block diagram illustrating one of the repair circuits in FIG. 5 according to exemplary embodiments.

Each configuration of the repair circuits 502~50J may be substantially the same as a configuration of a repair circuit 501.

Referring to FIG. 9, the repair circuit 501 includes a fail address storage table 510, a column address comparator 515, a fuse circuit 520, a signal generator 530 and a repair signal generator 540.

The fail address storage table 510 may store defective (fail) column address information FCAI associated with column address information of defective cells of a corresponding segment.

The column address comparator 515 may compare the column address CADDR with the fail column address information FCAI to output a column match signal CMTH indicating whether the column address CADDR matches the fail column address information FCAI to the fuse circuit 520 and the repair signal generator 540. The column match signal CMTH may indicate whether the column address CADDR matches the fail column address information FCAI. The fail address storage table 510 may have a similar configuration with the fail address storage table 410 of FIG. 7.

The fuse circuit 520 includes a plurality of fuse sets 521, 522 and 523. The fuse sets 521, 522 and 523 may correspond to segments in the first direction D1.

Each of the plurality of fuse sets 521, 522 and 523 may include a first region 521a and a second region 521b. The first region 521a may store a segment information SGI associated with whether each of segments is to be replaced with a segment in a different row block and the second region 521b may store a fuse bit MFB associated with whether the corresponding segment is to be replaced with a spare segment. The fuse sets 521, 522 and 523 may provide the segment information SGI and the fuse bit FB to the signal generator 530 and the repair signal generator 540, in response to the column match signal CMTH.

The signal generator 530 may generate a first internal selection signal ISELa1 and a second internal selection signal ISELb1 associated with selecting the corresponding segment based on the row block information signal RBIN, the segment information SGI and the fuse bit FB. The signal generator 530 may provide the first internal selection signal ISELa1 and the second internal selection signal ISELb1 to a corresponding sub column decoder.

The repair signal generator 540 may determine logic levels of the first repair signal CREN1 and the second repair signal CREN2 based on the column match signal CMTH, the segment information SGI and the fuse bit FB. For example, when the column match signal CMTH indicates that the column address CADDR does not match the defective column address information FCAI, the repair signal generator 540 deactivates the first repair signal CREN1 and the second repair signal CREN2 with a low level. When the first repair signal CREN1 and the second repair signal CREN2 are deactivated, the first sub column decoder 551 in FIG. 5 may activate a corresponding one of the column selection signals CSL.

For example, when the column match signal CMTH indicates the column address CADDR matches the fail column address information FCAI and the fuse bit FB has a high level indicating that the corresponding segment is to be replaced with the spare segment, the repair signal generator 540 activates the first repair signal CREN1 with a high level and deactivates the second repair signal CREN2 with a low level. In this case, the sub column decoder 551 in FIG. 5 connected to the corresponding segment unselects a corresponding one of the column selection lines CSL.

In this case, the repair circuit 50I connected to a spare segment deactivates the first repair signal CREN1 with a low level and activates the second repair signal CREN2 with a high level. In this case, the sub column decoder 551 in FIG. 5 selects the spare column selection line SC SL connected to the spare segment.

Figure 10:
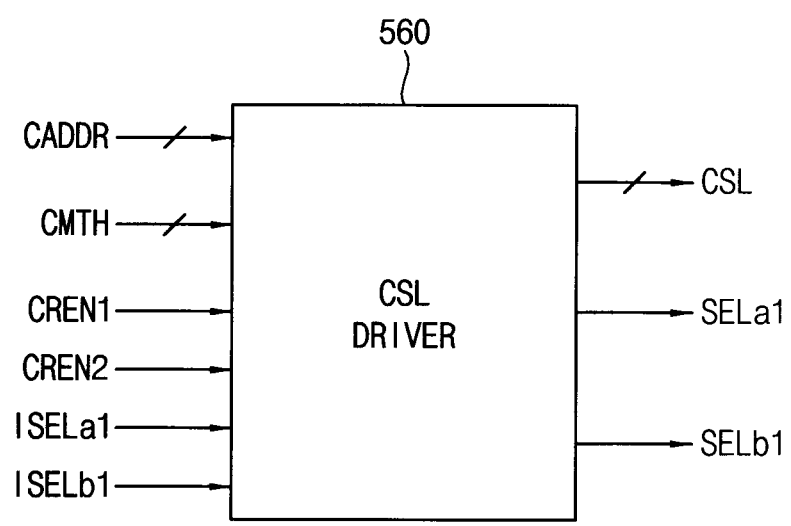
FIG. 10 is a block diagram illustrating one of the sub column decoders in FIG. 5 according to exemplary embodiments.

FIG. 10 is a block diagram illustrating one of the sub column decoders in FIG. 5 according to exemplary embodiments.

Each configuration of the sub column decoders 552~55J may be substantially the same as a configuration of the sub column decoder 551.

Referring to FIG. 10, the sub column decoder 551 may include a column selection line driver 560 which corresponds to the normal column selection line driver.

The column selection line driver 560 may select one of the column selection lines CSL and may determine logic levels of a first selection signal SELa1 and a second selection signal SELb1 associated with selecting the corresponding segment in response to the column address CADDR, the column match signal CMTH, the first repair signal CREN1, the second repair signal CREN2 and the internal selection signals ISELa1 and ISELb1.

For example, to select a segment of the first row block, which is a master, the column selection line driver 560 activates the first selection signal SELa1. To select a segment of the second row block, which is a slave, the column selection line driver 560 activates the second selection signal SELb1.

Figure 11:
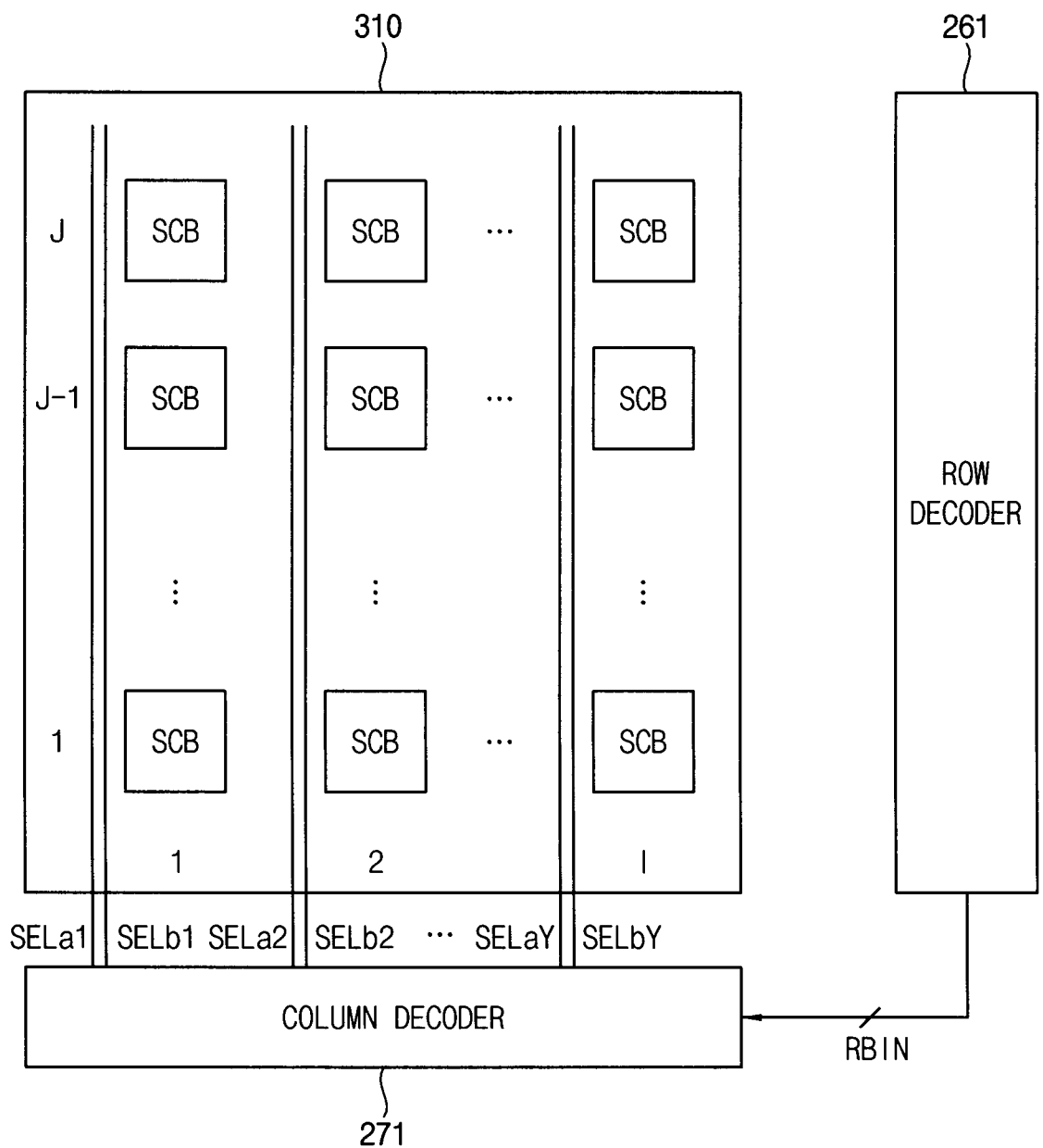
FIG. 11 illustrates that the first selection signals and the second selection signals are transferred in the semiconductor memory device of FIG. 5.

FIG. 11 illustrates that the first selection signals and the second selection signals are transferred to the semiconductor memory device of FIG. 5.

Referring to FIG. 11, the row decoder 261 provides the row block information signal RBIN to the column decoder 271 and the column decoder 271 transfers the first selection signals SELa1~SELaY and the second selection signals SELb1~SELbY in the first direction D1 with respect to the bank array 310. The first selection signals SELa1~SELaY and the second selection signals SELb1~SELbY are transferred to bit-line sense amplifier regions in the corresponding segment and may determine activation of a local sense amplifier circuit associated with the corresponding segment.

Figure 12:
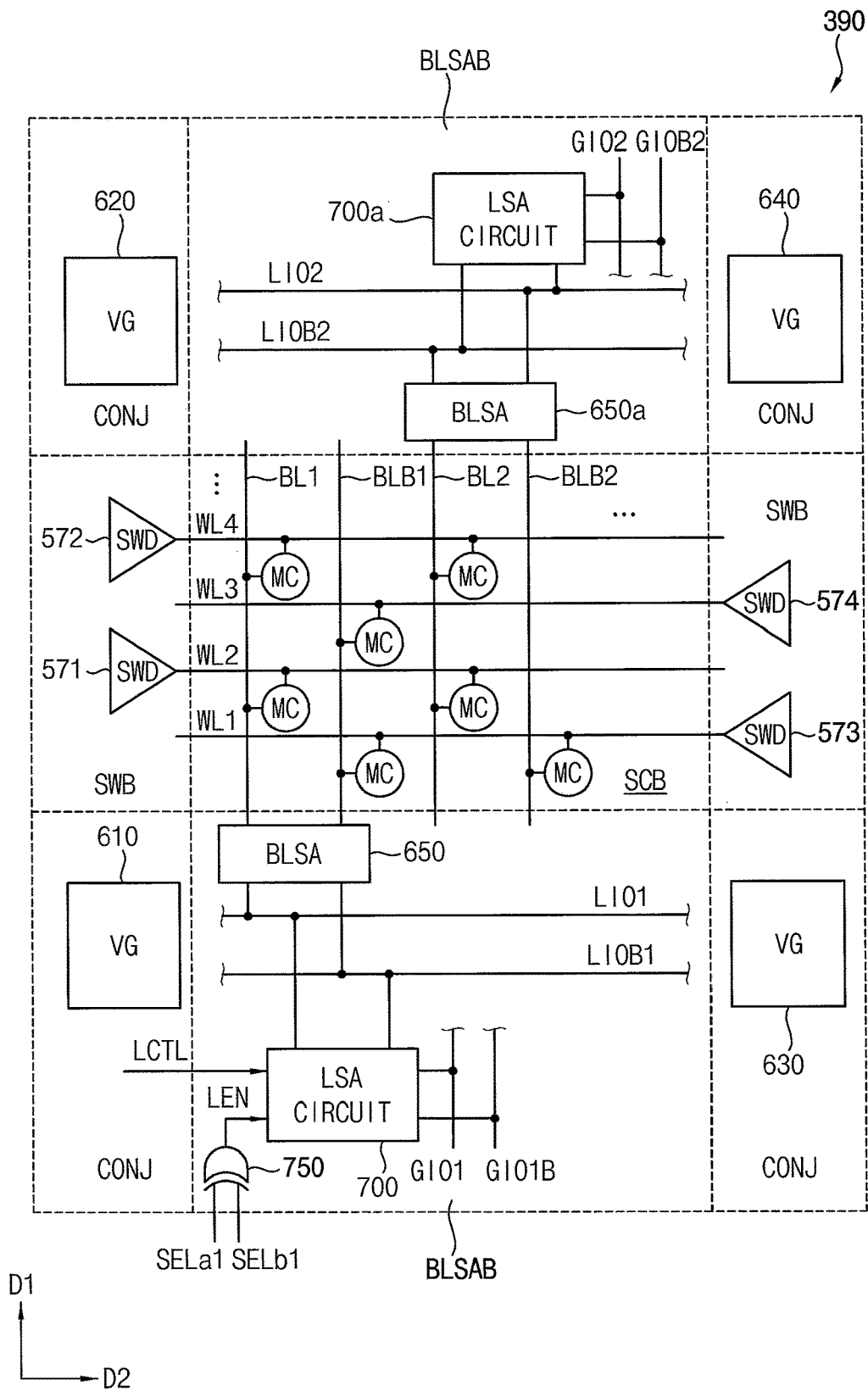
FIG. 12 illustrates a portion of the memory cell array in FIG. 5 according to exemplary embodiments.

FIG. 12 illustrates a portion of the memory cell array in FIG. 5 according to exemplary embodiments.

Referring to FIGS. 5 and 12, in the portion 390 (FIG. 5) of the memory cell array 300a, the sub-array block SCB, the bit-line sense amplifier regions BLSAB, the sub word-line driver regions SWB and the conjunction regions CONJ are disposed.

The sub-array block SCB includes a plurality of word-lines WL1~WL4 extending in a row direction (the second direction D2) and a plurality of bit-line pairs BL1~BL2 and BLB1~BLB2 extending in a column direction (the first direction D1). The sub-array block SCB includes a plurality of memory cells MCs disposed at intersections between the word-lines WL1~WL4 and the bit-line pairs BL1~BL2 and BLB1~BLB2.

With reference to FIG. 12, the sub word-line driver regions SWB include a plurality of sub word-line drivers 571, 572, 573 and 574 that respectively drive the word-lines WL1~WL4. The sub word-line drivers 571 and 572 may be disposed in the sub word-line driver region SWB, which is leftward (in this example), with respect to the sub-array block SCB. In addition, the sub word-line drivers 573 and 574 may be disposed in the sub word-line driver region SWB, which is rightward (in this example), with respect to the sub-array block SCB.

The bit-line sense amplifier regions BLSAB include bit-line sense amplifiers BLSA 650 and 650a coupled to the bit-line pairs BL1~BL2 and BLB1~BLB2, local sense amplifier circuits 700 and 700a and a logic gate 750. The bit-line sense amplifier 650 may sense and amplify a voltage difference between the bit-line pair BL and BLB to provide the amplified voltage difference to a local I/O line pair LIO1 and LIOB1.

The local sense amplifier circuit 700 controls connection between the local I/O line pair LIO1 and LIOB1 and a global I/O line pair GIO1 and GIOB1 in response to a local enable signal LEN and a local control signal LCTL, and the local sense amplifier circuit 700a controls connection between the local I/O line pair LIO2 and LIOB2 and a global I/O line pair G1O2 and GIOB2 in response to a corresponding local enable signal and a corresponding local control signal. The logic gate 750 performs a logical operation on the first selection signal SELa1 and the second selection signal SELb1 and to provide the local enable signal LEN to the local sense amplifier circuit 700. The first selection signal SELa1 and the second selection signal SELb1 may be received from the sub column decoder 551. The logic gate 750 may include an exclusive OR gate and the logical operation may correspond to an exclusive OR operation. Therefore, if a first segment in the first row block is to be replaced with a first segment in the second row block, a local sense amplifier circuit associated with the first segment in the first row block be deactivated and a local sense amplifier circuit associated with the first segment in the second row block may be activated.

As illustrated in FIG. 12, the bit-line sense amplifiers 650 and 650a may be alternately disposed at upper portion and a lower portion of the sub-array block SCB. The conjunction regions CONJ are disposed adjacent to the bit-line sense amplifier regions BLSAB, the sub word-line driver regions SWB and the sub-array block SCB. A plurality of voltage generators 610, 620, 630 and 640 may be disposed in the conjunction regions CONJ.

Figure 13:
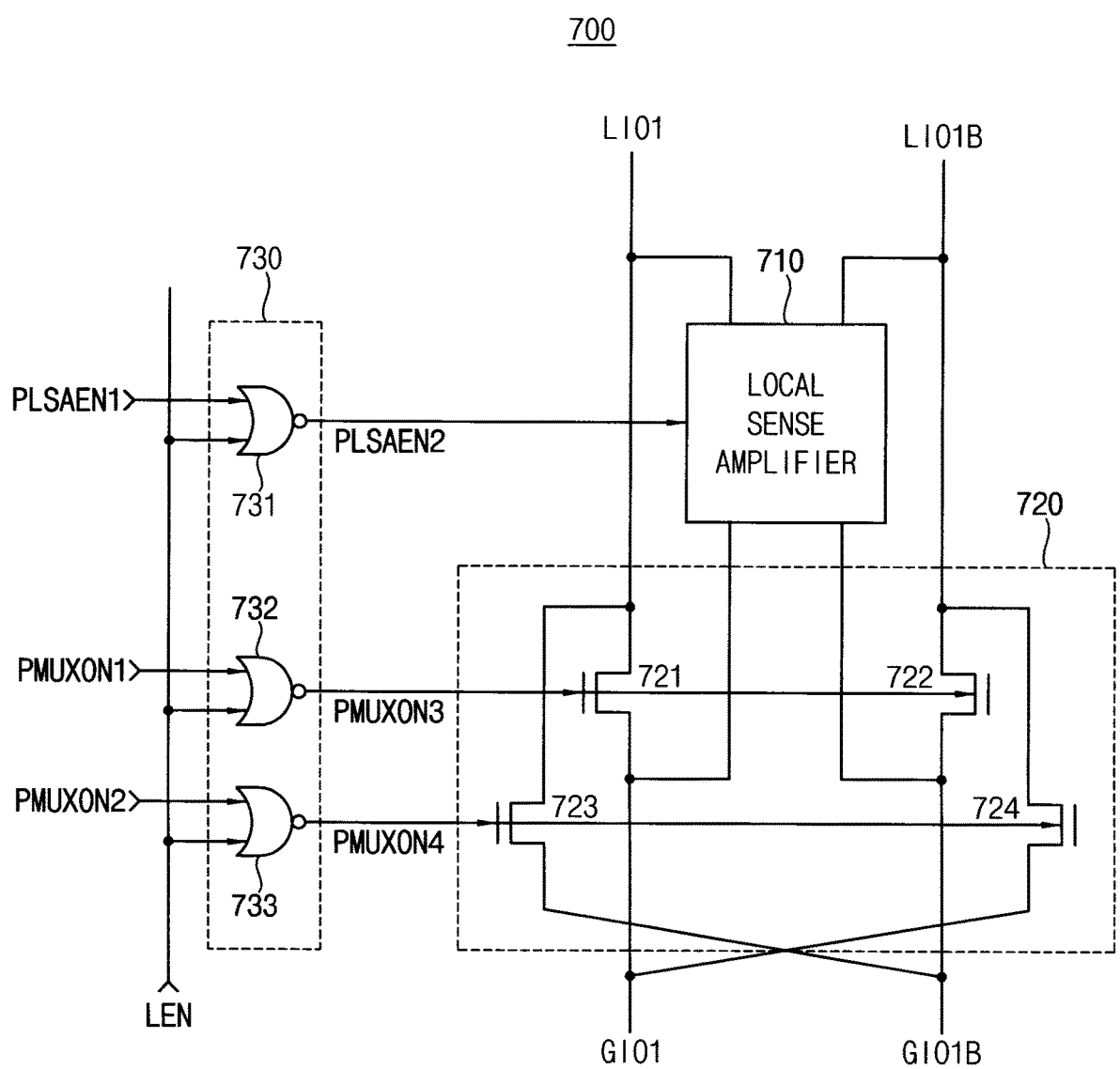
FIG. 13 illustrates the local sense amplifier circuit in FIG. 12 according to exemplary embodiments.

FIG. 13 illustrates the local sense amplifier circuit in FIG. 12 according to exemplary embodiments.

Referring to FIG. 13, the local sense amplifier circuit 700 includes a local sense amplifier 710, a local I/O line controller 720, and an activation control circuit 730.

The activation control circuit 730 performs an XOR operation on the local enable signal LEN and each of a first local sense enable signal PLSAEN1, a first connection control signal PMUXON1 and a second connection control signal PMUXON2 and outputs a second local sense enable signal PLSAEN2, a third connection control signal PMUXON3 and a fourth connection control signal PMUXON4.

Therefore, logic levels of the second local sense enable signal PLSAEN2, the third connection control signal PMUXON3 and the fourth connection control signal PMUXON4 may be same as or may be opposite to logic levels of the first local sense enable signal PLSAEN1, the first connection control signal PMUXON1 and the second connection control signal PMUXON2, respectively, according to a logic level of the local enable signal LEN. The activation control circuit 730 includes first through third gates 731, 732 and 733.

The local sense amplifier 710 amplifies a voltage difference between the local I/O line pair LIO1 and LIOB1 in response to the second local sense enable signal PLSAEN2 to provide the amplified voltage difference to the global I/O line pair GIO1 and GIOB1. The local I/O line controller 720 includes first through fourth NMOS transistors 721, 722, 723 and 724 and controls connection between the local I/O line pair LIO1 and LIOB1 and the global I/O line pair GIO1 and GIOB1 in response to the third connection control signal PMUXON3 and the fourth connection control signal PMUXON4.

For example, when each of the first local sense enable signal PLSAEN1, the first connection control signal PMUXON1 and the second connection control signal PMUXON2 is a high level and the local enable signal LEN is a high level, each of the second local sense enable signal PLSAEN2, the third connection control signal PMUXON3 and the fourth connection control signal PMUXON4 becomes a low level. Therefore, the local sense amplifier 710 is disabled and the local I/O line controller 720 cuts off the connection between the local I/O line pair LIO1 and LIOB1 and the global I/O line pair GIO1 and GIOB1.

For example, when each of the first local sense enable signal PLSAEN1, the first connection control signal PMUXON1 and the second connection control signal PMUXON2 is a high level and the local enable signal LEN is a low level, each of the second local sense enable signal PLSAEN2, the third connection control signal PMUXON3 and the fourth connection control signal PMUXON4 becomes a high level. Therefore, the local sense amplifier 710 is enabled and the local I/O line controller 720 provides the connection between the local I/O line pair LIO1 and LIOB1 and the global I/O line pair GIO1 and GIOB1.

Figure 14:
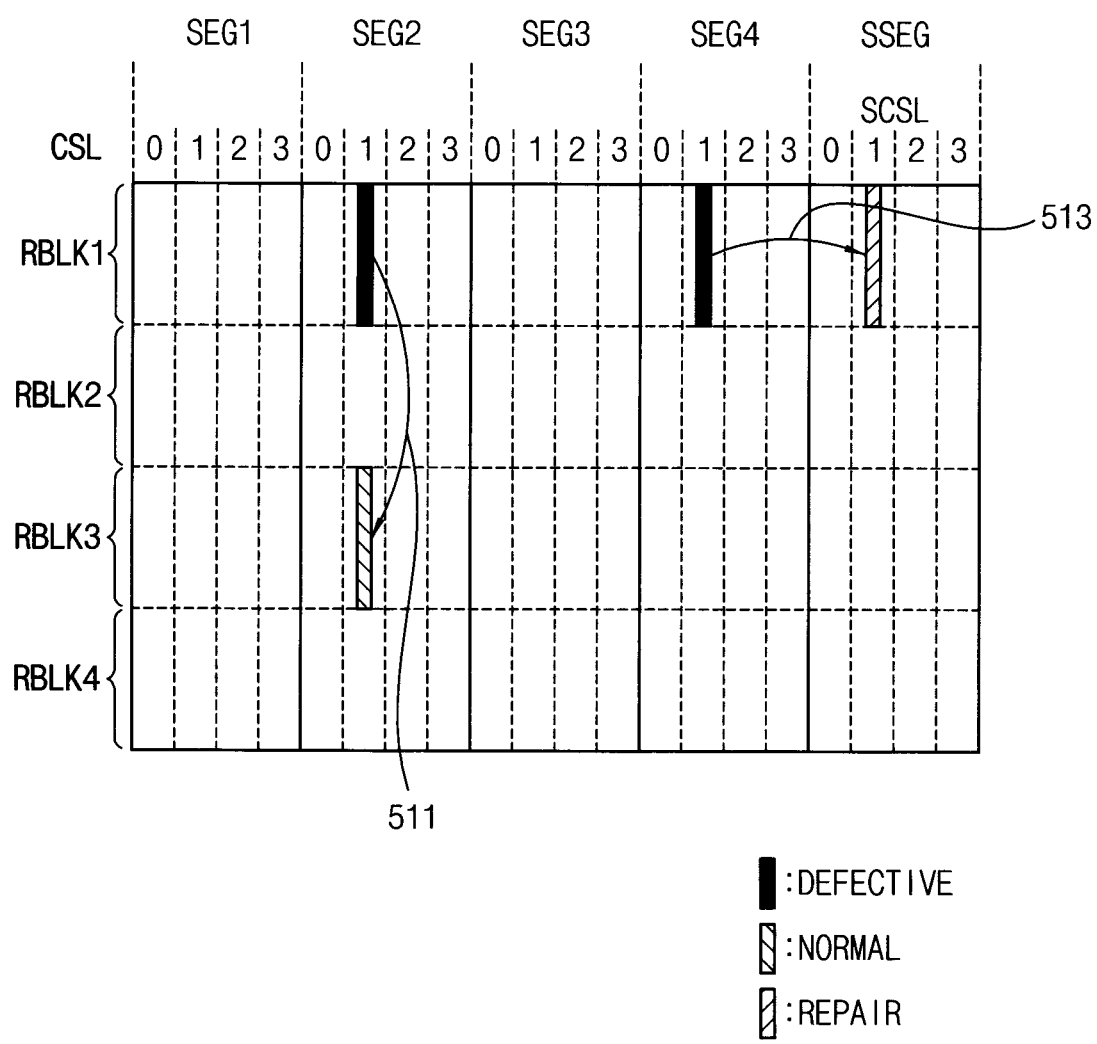
FIG. 14 illustrates that the column decoder 271 performs a column repair operation in the bank array in FIG. 2A.

FIG. 14 illustrates that the column decoder 271 performs a column repair operation in the bank array in FIG. 2A.

In FIG. 14, it is assumed that the row block RBLK1 (a first row block) is a master and the row block RBLK3 (a second row block) is mapped as a slave to the row block RBLK1.

Referring to FIG. 14, the segment SEG2 (a first segment) in the row block RBLK1 includes a defective memory cell. If a column selection line CSL1 is enabled, the column decoder 271 replaces the defective memory cell of the segment SEG2 in the row block RBLK1 with a normal memory cell of the row block RBLK3 as a reference numeral 511 indicates. The defective memory cell of the segment SEG4 (a second segment) in the row block RBLK1 is replaced with a spare memory cell of the spare segment SSEG in the row block RBLK1 by enabling a spare column selection line SCSL1 as a reference numeral 513 indicates.

Figure 15:
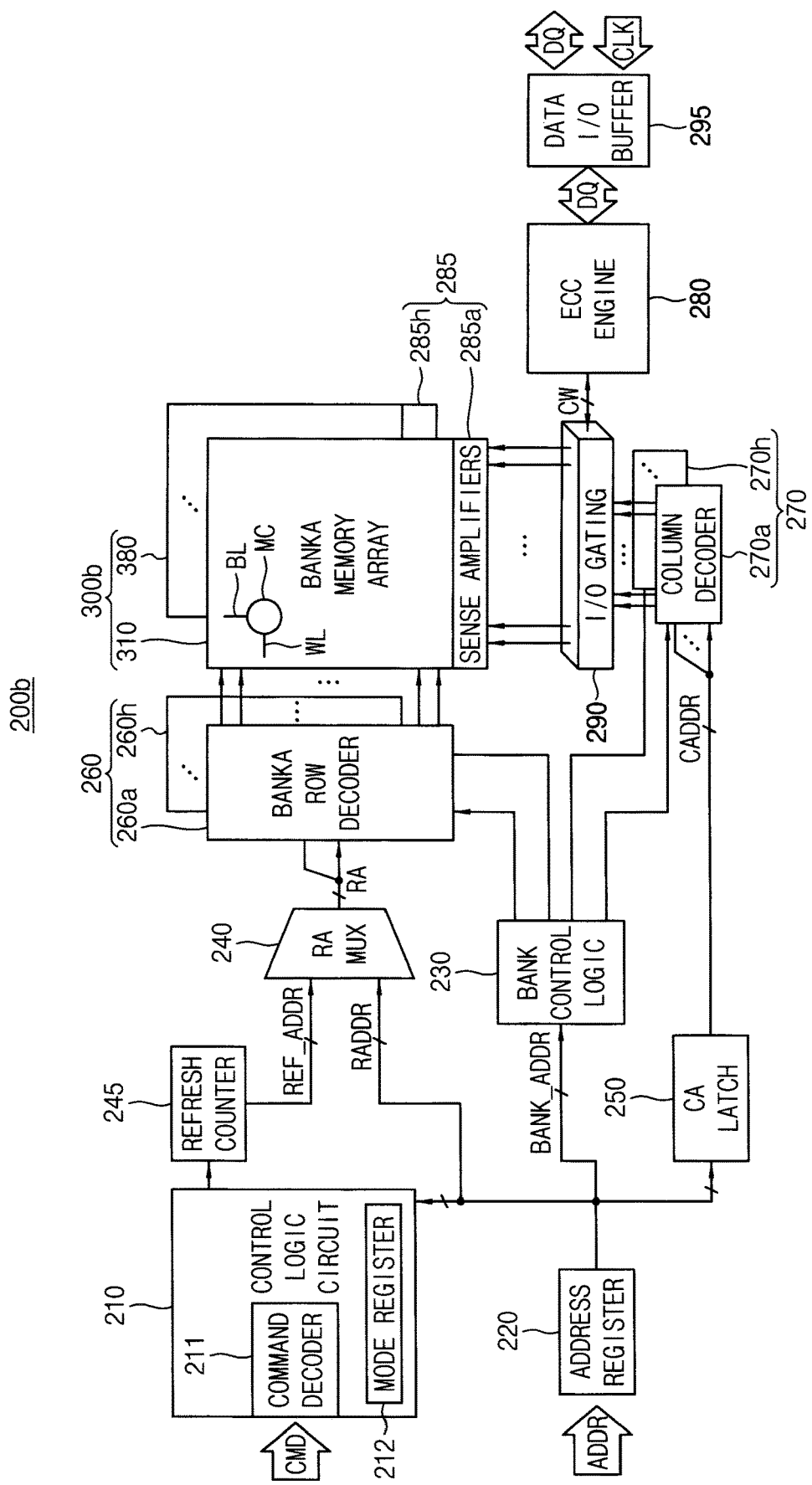
FIG. 15 is a block diagram illustrating another example of the semiconductor memory device in FIG. 1 according to exemplary embodiments.

FIG. 15 is a block diagram illustrating another example of the semiconductor memory device in FIG. 1 according to exemplary embodiments.

Referring to FIG. 15, a semiconductor memory device 200b includes a control logic circuit 210, an address register 220, a bank control logic 230, a refresh counter 245, a row address multiplexer 240, a column address latch 250, a row decoder 260, a column decoder 270, the memory cell array 300b, a sense amplifier unit 285, an input/output (I/O) gating circuit 290, an ECC engine 280 and a data I/O buffer 295.

The memory cell array 300b includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BL.

The address register 220 receives an address ADDR including a bank address BANK_ADDR, a row address RADDR and a column address CADDR from the memory controller 100. The address register 220 provides the received bank address BANK_ADDR to the bank control logic 230, provides the received row address RADDR to the row address multiplexer 240, and provides the received column address CADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address RADDR from the address register 220, and receives a refresh row address REF ADDR from the refresh counter 245. The row address multiplexer 240 selectively outputs one of the row address RADDR and the refresh row address REF ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address RA. In addition, the activated bank row decoder activates a spare word-line corresponding to a spare row address output from the repair control circuit 400 simultaneously with activating the word-line corresponding to the row address RA.

The column address latch 250 receives the column address CADDR from the address register 220, and temporarily stores the received column address CADDR. In some embodiments, in a burst mode, the column address latch 250 generates column addresses by increasing the received column address CADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANL_ADDR and the column address CADDR through the I/O gating circuit 290. The I/O gating circuit 290 includes a circuitry for gating input/output data, and further includes read data latches for storing data that is output from the first through eighth bank arrays 310~380, and write drivers for writing data to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 280. The data DQ to be written to one bank array of the first through eighth bank arrays 310~380 may be provided to the data I/O buffer 295 from the memory controller 100 is written in one bank array by the write drivers after an ECC encoding is performed on the data DQ by the ECC engine 280.

The data I/O buffer 295 may provide the data DQ from the memory controller 100 to the ECC engine 280 in a write operation of the semiconductor memory device 200b, based on the clock signal CLK and may provide the data DQ from the ECC engine 280 to the memory controller 100 in a read operation of the semiconductor memory device 200b.

The ECC engine 280, in the write operation, may generate parity bits based on the data DQ from the data I/O buffer 295, and may provide the I/O gating circuit 290 with the codeword CW including the data DQ and the parity bits. The I/O gating circuit 290 may write the codeword CW in one bank array. In addition, the ECC engine 280, in the read operation, may receive the codeword CW, which is read from one bank array, from the I/O gating circuit 290. The ECC engine 280 may perform an ECC decoding on the data DQ based on the parity bits in the codeword CW to correct at least one error bit in the data DQ, thereby providing corrected data to the data I/O buffer 295.

The control logic circuit 210 may control operations of the semiconductor memory device 200b. For example, the control logic circuit 210 may generate control signals for the semiconductor memory device 200b in order to perform a write operation or a read operation. The control logic circuit 210 includes a command decoder 211 that decodes a command CMD received from the memory controller 100 and a mode register 212 that sets an operation mode of the semiconductor memory device 200b.

Each of the first through eighth bank arrays 310~380 may include a plurality of row blocks which are identified by row identity bits of the row address RADDR. Each of the first through eighth bank row decoders 260a~260h may employ the row decoder 261 in FIG. 5 and may provide row block information signal to corresponding one of the first through eighth bank column decoders 270a~270h.

Each of the first through eighth bank column decoders 270a~270h may employ the column decoder 271 in FIG. 5 and may perform a column repair by a unit of a segment by simultaneously activating a first word-line of the first row block and a second word-line of the second row block mapped as a slave to the first row block based on the column address CADDR and the row block information signal if the first row block, designated as a master, is accessed.

Figure 16:
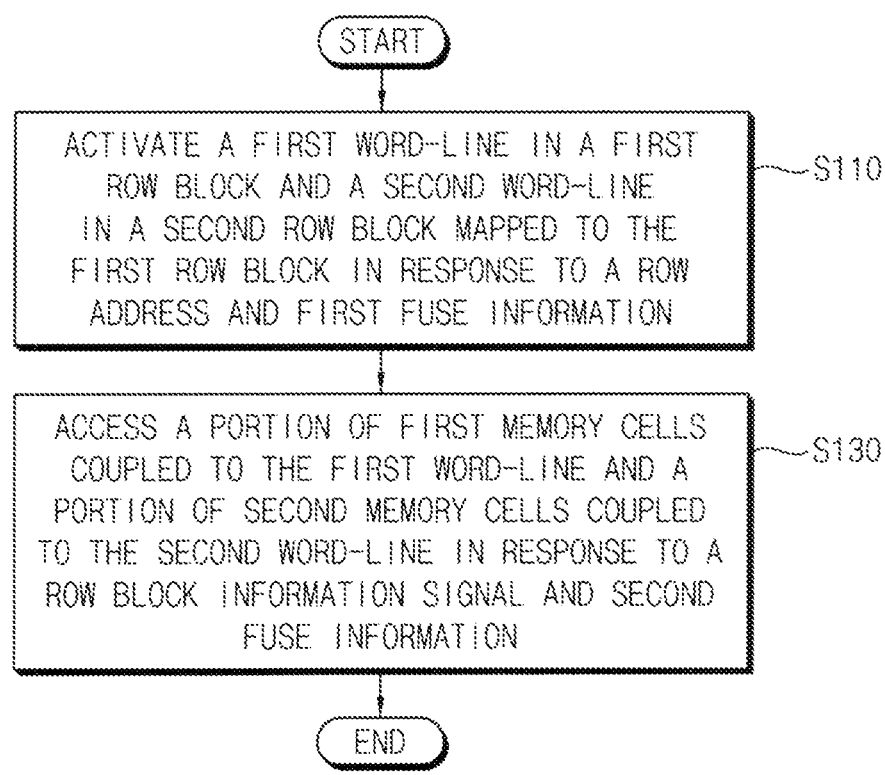
FIG. 16 is a flow chart illustrating a method of operating a semiconductor memory device according to exemplary embodiments.

FIG. 16 is a flow chart illustrating a method of operating a semiconductor memory device according to exemplary embodiments.

Referring to FIGS. 2 through 16, there is provided a method of operating a semiconductor memory device 200 that includes a memory cell array. The memory cell array includes a plurality of row blocks arranged in a first direction, each of the plurality of row blocks includes a plurality of dynamic memory cells coupled to word-lines and bit-lines, each of the plurality of the row blocks is identified by row block identity bits corresponding to a portion of bits of a row address, and each of the of row blocks includes a plurality of segments arranged in a second direction crossing the first direction. In the method, a row decoder 261 activates a first word-line of a first row block of the row blocks and a second word-line of a second row block, which is mapped as a slave to the first row block, of the row blocks in response to a row address and a first fuse information (S110).

Figure 17A:
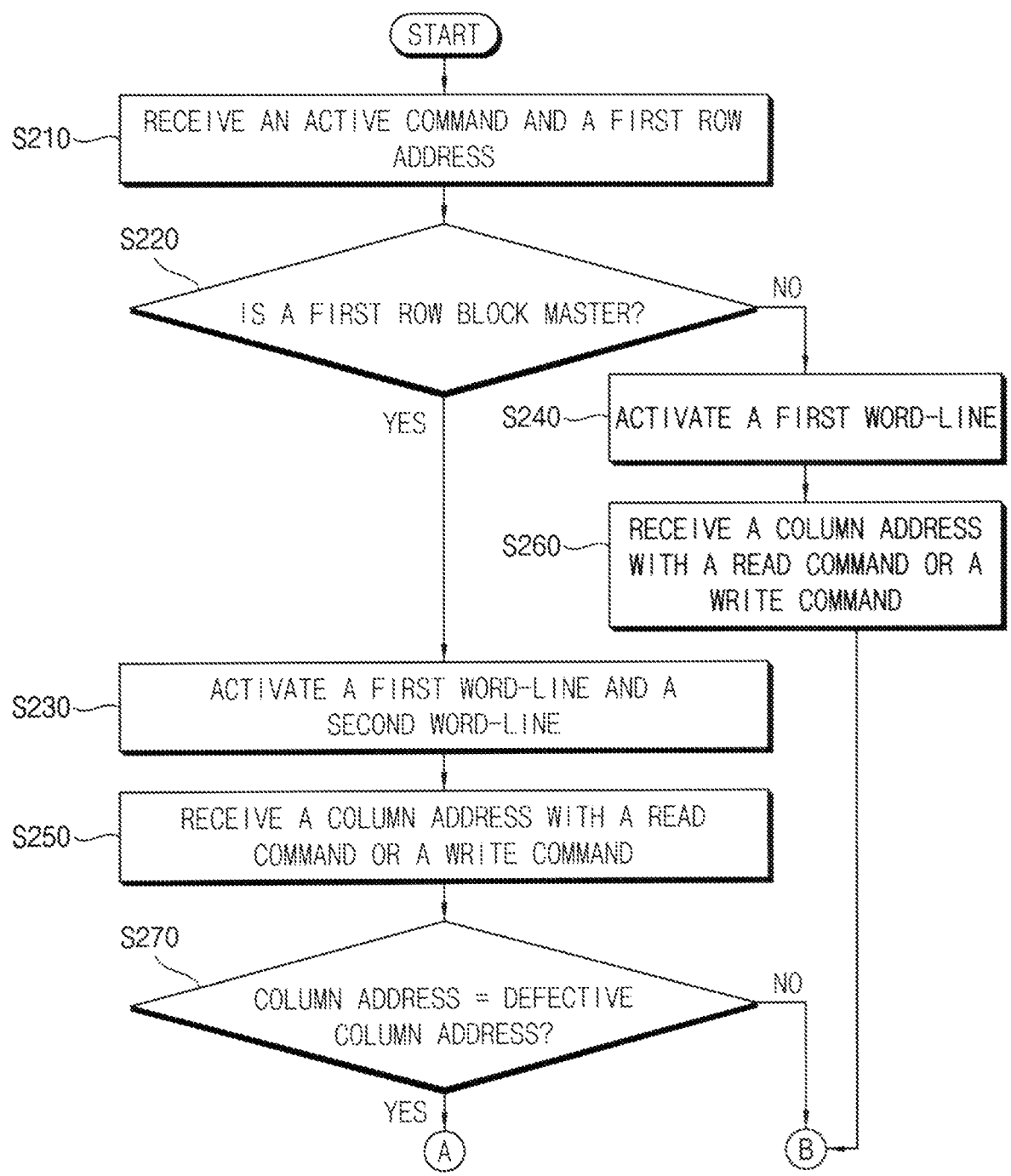
FIGS. 17A and 17B illustrate a method of operating a semiconductor memory device according to exemplary embodiments.
Figure 17B:
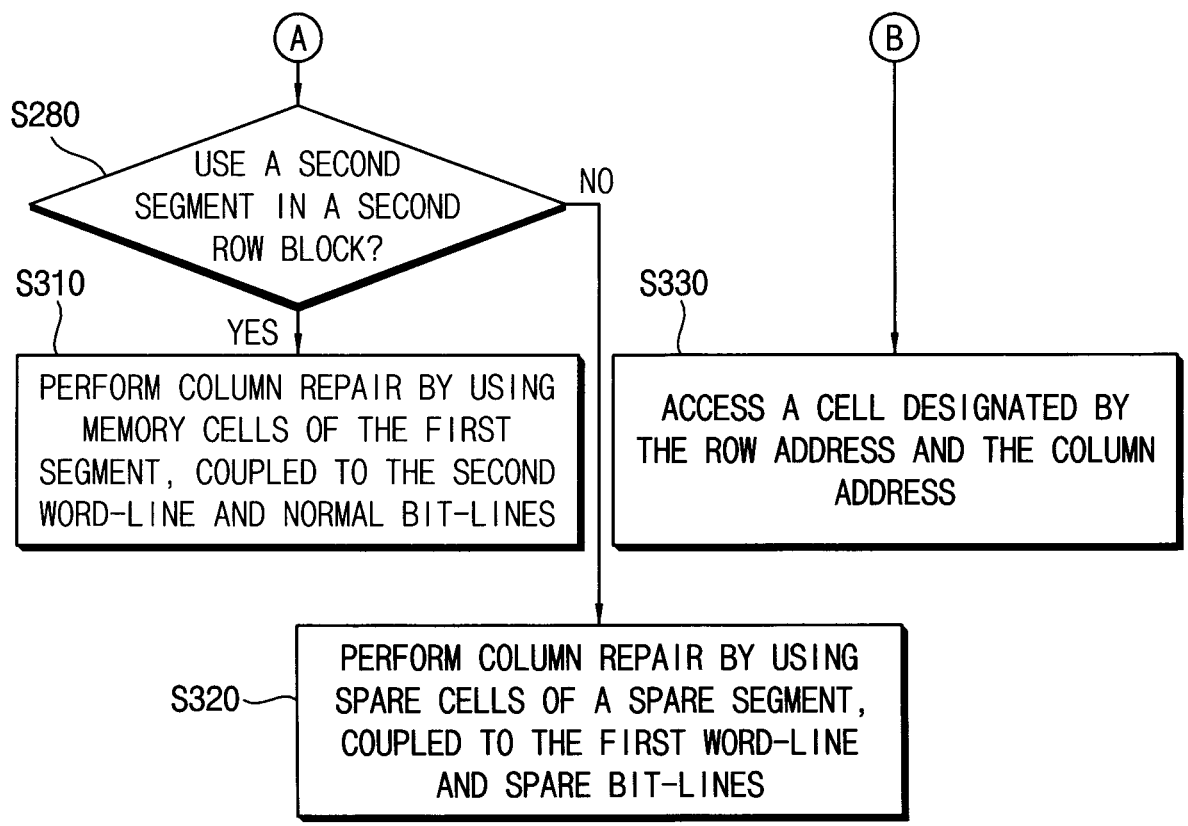

A column decoder 271 accesses a portion of first memory cells coupled to the first word-line and a portion of second memory cells coupled to the second word-line based on a column address, the row block information signal and a second fuse information (S120). The row block information signal indicates that the second word-line is activated FIGS. 17A and 17B illustrate a method of operating a semiconductor memory device according to exemplary embodiments.

Referring to FIGS. 2 through 16, 17A and 17B, the semiconductor memory device 200 receives an active command and a first row address designating a word-line of word-lines included in a first row block (S210). The row block information circuit 400 in the address decoder 261 determines whether the first row block is a master by referring to the first fuse information (S220). When the first row block is not the master (NO in S220), the row decoder 261 activates the first word-line (S240) and the column decoder 271 receives a column address with a write command or a read command (S260).

When the first row block is the master (YES in S220), the row decoder 261 activates the first word-line and the second word-line mapped as a slave to the first row block (S230) and the column decoder 271 receives a column address with a write command or a read command (S250). A corresponding repair circuit in the column decoder 271 determines whether the column address CADDR matches a defective column address of a bit-line coupled to the at least one defective cell (S270).

When the column address CADDR matches the defective column address (YES in S270), the corresponding repair circuit in the column decoder 271 determines whether to use the first segment in the second row block by referring to the second fuse circuit FC2. When the first segment in the second row block is determined to be used (YES in S280), the corresponding repair circuit in the column decoder 271 activates the column selection line CSL and a second selection signal, and data of memory cells in the first segment of the second row block is input/output (S310). When the first segment in the second row block is not to be used (NO in S280), the corresponding repair circuit in the column decoder 271 activates the spare column selection line SCSL and performs a column repair operation by using a spare memory cell coupled to the first word-line and the spare bit-line (S320).

When the column address CADDR does not match the defective column address (NO in S270), the column decoder 271 accesses a memory cell designated by the row address RADDR and the column address CADDR (S330).

Figure 18:
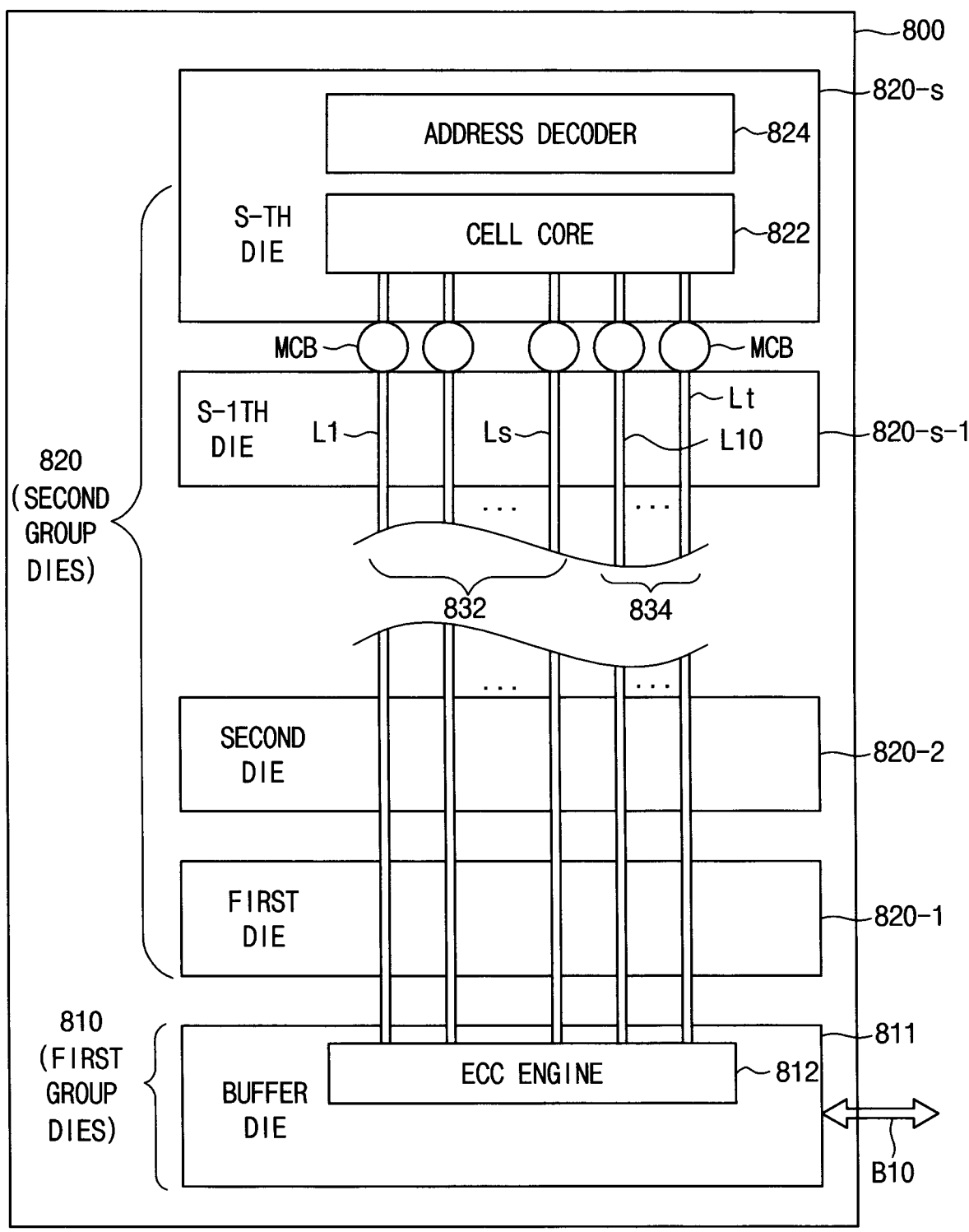
FIG. 18 is a block diagram illustrating a semiconductor memory device according to exemplary embodiments.

FIG. 18 is a block diagram illustrating a semiconductor memory device according to exemplary embodiments.

Referring to FIG. 18, a semiconductor memory device 800 may include a first die group 810 and a second die group 820.

The first die group 810 may include at least one buffer die 811. The second die group 820 may include a plurality of memory dies 820-1 to 820-s which is stacked on the first die group 810 (or, the buffer die 811) and conveys data through a plurality of through silicon via (TSV) lines extending from memory die 820-s, through intervening memory dies 820-s-1 to 820-1, to the first die group 810.

Each of the memory dies 820-1 to 820-s may include a cell core 822, which includes a memory cell array, and an address decoder 824. The memory cell array may include a plurality of bank arrays and each of the bank arrays may be divided into a plurality of row blocks. The row decoder 824 may employ the row decoder 261 and the column decoder 271 in FIG. 5 and may perform column repair by a unit of a segment.

The buffer die 811 may include an ECC engine 812, which corrects a transmission error using transmission parity bits when a transmission error is detected from the transmission data received through the TSV lines and generates error-corrected data. The ECC engine 812 may be referred to as a "via ECC engine".

The semiconductor memory device 800 may be a stack chip type memory device or a stacked memory device which conveys data and control signals through the TSV lines. The TSV lines may be also called 'through electrodes'.

A TSV line group 832 which is formed at one memory die 820-s may include a plurality of TSV lines L1 to Ls, and a parity TSV line group 834 may include a plurality of TSV lines L10 to Lt. The TSV lines L1 to Ls of the data TSV line group 832 and the parity TSV lines L10 to Lt of the parity TSV line group 834 may be connected to micro bumps MCB which are correspondingly formed among the memory dies 820-1 to 820-s.

Each of the memory dies 820-1 to 820-s may include DRAM cells each including at least one access transistor and one storage capacitor.

The semiconductor memory device 800 may have a three-dimensional (3D) chip structure or a 2.5 D chip structure to communicate with the memory controller through a data bus B10. The buffer die 810 may be connected with the memory controller through the data bus B10.

The first type ECC engine 822, denoted as the cell core ECC engine, may output transmission parity bits as well as the transmission data through the parity TSV line group 834 and the data TSV line group 832 respectively. The outputted transmission data may be data which is error-corrected by the first type ECC engine 822.

The ECC engine 812, denoted as the via ECC engine, may determine whether a transmission error occurs in the transmission data received through the data TSV line group 832, based on the transmission parity bits received through the parity TSV line group 834. When a transmission error is detected, the ECC engine 812 may correct the transmission error in the transmission data using the transmission parity bits. When the transmission error is uncorrectable, the ECC engine 812 may output information indicating occurrence of an uncorrectable data error.

Figure 19:
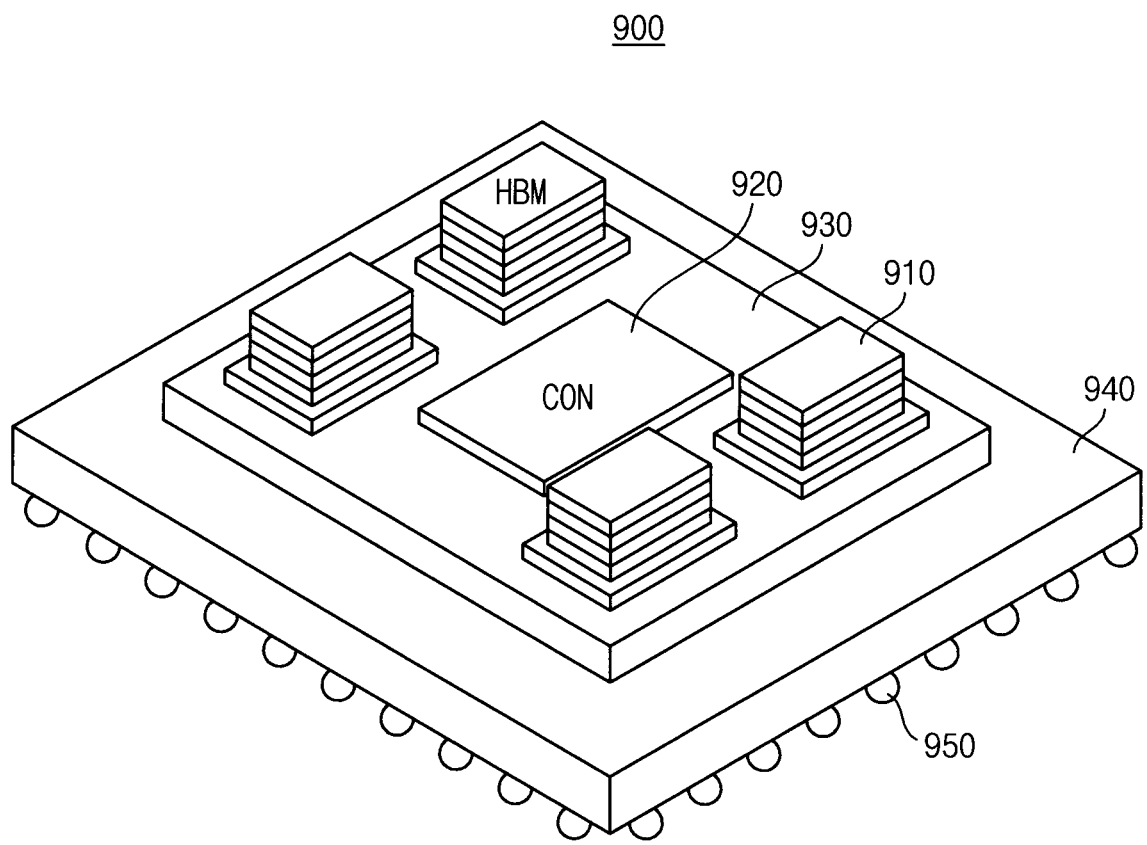
FIG. 19 is a diagram illustrating a semiconductor package including a stacked memory device according to exemplary embodiments.

FIG. 19 is a diagram illustrating a semiconductor package including a stacked memory device according to exemplary embodiments.

Referring to FIG. 19, a semiconductor package 900 may include one or more stacked memory devices 910 and a memory controller 920. The stacked memory devices 910 and the memory controller 920 may be mounted on an interposer 930, and the interposer 930 on which the stacked memory devices 910 and the memory controller 920 are mounted may be mounted on a package substrate 940. The memory controller 920 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the stacked memory devices 910 may employ the semiconductor memory device 800 in FIG. 18. Therefore, each of the stacked memory devices 910 may perform column repair by a unit of a segment.

As described above, the stacked memory devices 910 may be mounted on the interposer 930, and the memory controller 920 may communicate with the stacked memory devices 910. For example, each of the stacked memory devices 910 and the memory controller 920 may include a physical region, and communication may be performed between the stacked memory devices 910 and the memory controller 920 through the physical region. Meanwhile, when each of the stacked memory devices 910 includes a direct access region, a test signal may be provided to each of the stacked memory devices 910 through conductive means (e.g., solder balls 950) mounted under the package substrate 940 and the direct access region.

Aspects of the present inventive concept may be applied to systems using semiconductor memory devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
a memory cell array including a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines;
a row decoder configured to:
receive a row address,
activate a first word-line of a first row block of the plurality of row blocks in response to the row address, wherein the first row block is identified with at least one block address bit of the row address,
determine whether the first row block is a master block based on a first fuse information indicating that the first row block is the master block and a second row block of the plurality of row blocks is mapped as a slave to the master block,
activate, in response to the determining of whether the first row block is the master block, a second word-line of the second row block of the plurality of row blocks, and
output, in response to the activating of the second word-line, a row block information signal indicating that the second word-line is activated; and
a column decoder configured to:
receive a column address, and
access a portion of first memory cells coupled to the first word-line or a portion of second memory cells coupled to the second word-line of the second row block based on the column address, the row block information signal and a second fuse information indicating a first segment of the plurality of segments disposed at an intersection of the master block and a first column block associated with the column address.

2. The semiconductor memory device of claim 1,
wherein the plurality of segments include a plurality of normal segments and at least one spare segment, each of the plurality of normal segments includes a plurality of normal memory cells, and the at least one spare segment includes a plurality of spare memory cells,
wherein the row address is received with an active command, and
wherein the column address is received with a write command or a read command.

3. The semiconductor memory device of claim 2,
wherein the portion of the second memory cells coupled to the second word-line corresponds to a portion of normal memory cells coupled to the second word-line in the second row block, and the portion of the normal memory cells is disposed in a second segment of the plurality of segments at an intersection of the second row block and the first column block.

4. The semiconductor memory device of claim 2,
wherein the portion of the first memory cells coupled to the first word-line corresponds to a portion of the spare memory cells of the first row block.

5. The semiconductor memory device of claim 3,
wherein the column decoder is configured to select the first segment in the second row block, in place of the first segment of the first row block, based on the second fuse information, and
wherein the first segment of the first row block includes at least one defective cell.

6. The semiconductor memory device of claim 5,
wherein the column decoder is configured to replace the second segment in the second row block with a third segment disposed at an intersection of a third row block different from the second row block and the first column block, and wherein the third row block is mapped as the slave with respect to the second row block.

7. The semiconductor memory device of claim 1, wherein the row decoder includes a plurality of row block fuse circuits, each of the row block fuse circuits associated with a corresponding one of the plurality of row blocks, and wherein each of the plurality of row block fuse circuits includes:

a row block information table storage configured to store the first fuse information including a master bit, a row block information of a corresponding row block and a slave row block information, the master bit indicating whether the corresponding row block is a master row block, the slave row block information being associated with information of a slave row block mapped to the master row block; and a signal generator configured to output the row block information signal to the column decoder at least based on the slave row block information.

8. The semiconductor memory device of claim 7, wherein each of the plurality of row block fuse circuits further includes:

a defective address table storage configured to store a defective row address of at least one defective cell included in the corresponding row block;

a row address comparator configured to compare the row address with the defective row address to output a row match signal indicating whether the defective row address matches corresponding bits of the row address; and a row block comparator configured to compare the at least one block address bit of the row address with row block address information associated with of the corresponding row block to output a row block match signal indicating whether the at least one block address bit matches the row block address information, and wherein the signal generator is configured to output the row block information signal in response to the row match signal, the row block match signal and the slave row block information.

9. The semiconductor memory device of claim 1, wherein the column decoder includes:

a plurality of sub column decoders respectively connected to the plurality of segments; and a plurality of repair circuits respectively connected to the plurality of sub column decoders, and wherein each of the plurality of repair circuits is configured to apply a first repair signal, a second repair signal, a first internal selection signal and a second internal selection signal to a corresponding sub column decoder of the plurality of sub column decoders, the first internal selection signal and the second internal selection signal being associated with selection of each of the segments.

10. The semiconductor memory device of claim 9, wherein each of the plurality of repair circuits includes:

a fuse circuit that includes a plurality of fuse sets, wherein each of the plurality of fuse sets stores a segment information associated with selection of one of the plurality of segments; and a signal generator configured to generate the first internal selection signal and the second internal selections signal based on the row block information signal and the segment information.

11. The semiconductor memory device of claim 10, wherein each of the plurality of repair circuits further includes:

a defective address table storage configured to store defective column address information of at least one defective cell of a corresponding segment of the plurality of segments;

a column address comparator configured to compare the column address with the defective column address information to output a column match signal indicating whether the column address matches the defective column address information; and a repair signal generator configured to generate the first repair signal and the second repair signal based on the column match signal and the segment information.

12. The semiconductor memory device of claim 11, wherein each of the plurality of sub column decoders includes:

a plurality of normal column selection line drivers respectively connected to normal segments of each of the row blocks; and at least one spare column selection line driver respectively connected to at least one spare segment of the row blocks.

13. The semiconductor memory device of claim 12, wherein each of the plurality of normal column selection line drivers is configured to select a column selection line based on the column address, the column match signal, the first repair signal, the second repair signal, the first internal selection signal and the second internal selections signal and is configured to determine logic levels of a first selection signal and a second selection signal associated with selection of a corresponding segment of the plurality of segments.

14. The semiconductor memory device of claim 13, wherein in response to the column match signal indicating that the column address matches the defective column address information and the segment information indicating that the corresponding segment is to be replaced with the first segment in the second row block, each of the plurality of normal column selection line drivers deactivates the first selection signal and activates the first selection signal.

15. The semiconductor memory device of claim 13, wherein the plurality of segments are disposed in the first direction and the second direction of a substrate, and wherein the memory cell array further includes:

a plurality of sub word-line driver regions disposed between the plurality of segments in the first direction;

a plurality of bit-line sense amplifier regions disposed between the plurality of segments in the second direction;

a plurality of local sense amplifier circuits disposed in the plurality of bit-line sense amplifier regions; and a logic gate configured to perform a logical operation on the first selection signal and the second selection signal to provide a local enable signal to a corresponding local sense amplifier circuit of the plurality of local sense amplifier circuits, the first selections signal being associated with activation of the second word-line, the second selection signal being associated with selection of each of the segments.

16. The semiconductor memory device of claim 15,
wherein the memory cell array includes a plurality of bank arrays, and
wherein each of the plurality of bank arrays includes the plurality of row blocks.

17. A semiconductor memory device comprising:
a memory cell array including a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines;
a row decoder configured to:
receive a row address;
activate a first word-line of a first row block of the plurality of row blocks in response to the row address, wherein the first row block is identified with at least one block address bit of the row address,
determine whether the first row block is a master block based on a first fuse information indicating that the first row block is the master block and a second row block of the plurality of row blocks is mapped as a slave to the master block,
activate, in response to the determining of whether the first row block is the master block, a second word-line of the second row block of the plurality of row blocks, and
output, in response to the activating of the second word-line, a row block information signal indicating that the second word-line is activated;
a column decoder configured to:
receive a column address,
access a portion of first memory cells coupled to the first word-line or a portion of second memory cells coupled to the second word-line based on the column address, the row block information signal and a second fuse information indicating a first segment of the plurality of segments disposed at an intersection of the master block and a first column block, among the plurality of column blocks, associated with the column address; and
a peripheral circuit configured to control the row decoder and the column decoder based on a command and an address received from an outside, the address including the row address and the column address.

18. The semiconductor memory device of claim 17,
wherein the peripheral circuit includes an error correction code (ECC) engine, and
wherein the ECC engine is configured to perform ECC encoding on data to be stored in the memory cell array and is configured to perform ECC decoding on data read from the memory cell array.

19. A method of operating a semiconductor memory device,
wherein the semiconductor memory device includes a memory cell array including a plurality of row blocks arranged in a first direction, a plurality of column blocks arranged in a second direction different from the first direction and a plurality of segments each of which is disposed at a corresponding intersection of the plurality of row blocks and the plurality of column blocks, each of the plurality of row blocks including a plurality of dynamic memory cells coupled to word-lines and bit-lines,
the method comprising:
activating, by a row decoder, a first word-line of a first row block of the row blocks in response to a row address, wherein the first row block is identified with at least one block address bit of the row address;
determining, by the row decoder, whether the first row block is a master block based on a first fuse information indicating that the first row block is the master block;
activating, by the row decoder and in response to the determining of whether the first row block is the master blocks, a second word-line of a second row block of the row blocks;
generating, in response to the activating of the second word-line, a row block information signal indicating that the second word-line is activated; and
accessing, by a column decoder, a portion of first memory cells coupled to the first word-line or a portion of second memory cells coupled to the second word-line based on a column address, the row block information signal and a second fuse information, the second fuse information indicating that a first segment of the plurality of segments disposed at an intersection of the master block and a first column block associated with the column address.

20. The method of claim 19,
wherein the plurality of segments include a plurality of normal segments and at least one spare segment, each of the plurality of normal segments includes a plurality of normal memory cells, and the at least one spare segment includes a plurality of spare memory cells,
wherein the row address is received with an active command,
wherein the column address is received with a write command or a read command,
wherein the first segment coupled to the first word-line in the first row block includes at least one defective cell,
wherein the portion of the second memory cells coupled to the second word-line corresponds to a portion of the normal memory cells coupled to the second word-line in the second row block, and
wherein the portion of first memory cells coupled to the first word-line corresponds a portion of the plurality of spare memory cells of a spare segment, among the at least one spare segment, of the first row block.

* * * * *